United States Patent
Choi et al.

(10) Patent No.: US 12,112,795 B2
(45) Date of Patent: Oct. 8, 2024

(54) MEMORY DEVICE INCLUDING PREDECODER AND OPERATING METHOD THEREOF

(71) Applicant: Samsung Electronics Co., Ltd., Suwon-si (KR)

(72) Inventors: Kyu Won Choi, Suwon-si (KR); Tae Min Choi, Seoul (KR); Hyeong Cheol Kim, Suwon-si (KR); Chan Ho Lee, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 183 days.

(21) Appl. No.: 17/565,743

(22) Filed: Dec. 30, 2021

(65) Prior Publication Data

US 2022/0392513 A1 Dec. 8, 2022

(30) Foreign Application Priority Data

Jun. 8, 2021 (KR) .................. 10-2021-0074133

(51) Int. Cl.
*G11C 11/413* (2006.01)
*G11C 11/418* (2006.01)
*H03K 19/017* (2006.01)

(52) U.S. Cl.
CPC .......... *G11C 11/418* (2013.01); *G11C 11/413* (2013.01); *H03K 19/01742* (2013.01)

(58) Field of Classification Search
CPC ..... G11C 11/41; G11C 11/412; G11C 11/413; G11C 11/418; G11C 11/419
See application file for complete search history.

(56) References Cited

U.S. PATENT DOCUMENTS

| | | | |
|---|---|---|---|
| 8,824,237 B2 | 9/2014 | Wang | |
| 9,058,858 B2 | 6/2015 | Cheng et al. | |
| 9,466,347 B1 | 10/2016 | Pasotti et al. | |
| 9,503,091 B2 | 11/2016 | Kirihata et al. | |
| 9,536,578 B2 | 1/2017 | Jung et al. | |
| 2013/0083618 A1* | 4/2013 | Sathianathan | H03K 19/0963 365/230.06 |

(Continued)

FOREIGN PATENT DOCUMENTS

KR 2002-0028066 A 4/2002
KR 10-2015-0026052 A 3/2015

*Primary Examiner* — Alfredo Bermudez Lozada
(74) *Attorney, Agent, or Firm* — Harness, Dickey & Pierce, P.L.C.

(57) ABSTRACT

A memory device and operating method of the memory device are provided. The memory device comprises a memory cell storing data based on a first voltage, a row decoder selecting a wordline of the memory cell based on the first voltage, and a wordline predecoder configured to generate a "predec" signal, which is for generating a wordline voltage to be provided to the row decoder. The wordline predecoder is driven by the first voltage and a second voltage, which is different from the first voltage, receives a row address signal, associated with selecting the wordline, and an internal clock signal associated with adjusting operating timings of elements included in the memory device. The wordline predecoder performs a NAND operation on the row address signal and the internal clock signal, and provides the "predec" signal generated based on a result of the NAND operation to the row decoder.

19 Claims, 20 Drawing Sheets

(56) References Cited

U.S. PATENT DOCUMENTS

| | | | |
|---|---|---|---|
| 2014/0247081 A1* | 9/2014 | Yeung | H03K 19/0185 |
| | | | 327/333 |
| 2015/0302918 A1 | 10/2015 | Roy et al. | |
| 2016/0233866 A1* | 8/2016 | Ishizu | H03K 19/0008 |
| 2020/0234745 A1 | 7/2020 | Cheng et al. | |

* cited by examiner

| Data | SN1 | SN2 |
|---|---|---|
| 0 | L | H |
| 1 | H | L |

MEMORY DEVICE INCLUDING PREDECODER AND OPERATING METHOD THEREOF

CROSS-REFERENCE TO RELATED APPLICATION

This application claims priority to Korean Patent Application No. 10-2021-0074133, filed on Jun. 8, 2021, and all the benefits accruing therefrom under 35 U.S.C. § 119, the disclosure of which is incorporated herein by reference in its entirety.

BACKGROUND

Inventive concepts relate to a semiconductor device, and particularly, to a memory device equipped with a dual power line.

Semiconductor devices such as application processors may be configured as system-on-chips (SoCs) including a plurality of functional blocks (IP) (e.g. blocks of standard cells), and the SoCs may include static random access memories (SRAMs), which are typically used as cache and/or buffer memories. There is a trend to lower the driving voltage for a mobile device for the efficiency of power, but there is a limit in lowering the voltage provided to memory cells to ensure a sufficient margin for an SRAM included in the mobile device. However, the voltage provided to peripheral circuits can be lowered below the voltage provided to the memory cells. This type of SRAM power supply method may be referred to as a dual power supply scheme. However, as the difference between the voltage provided to the memory cells and the voltage provided to the peripheral circuits increases, a timing skew may occur. Thus, the need/desire of techniques for securing an operating margin for memory cells and/or reducing power consumption arises.

SUMMARY

Example embodiments of Inventive concepts provide a memory device equipped with a dual voltage line that consumes less power and/or has an operating margin secured.

Example embodiments of Inventive concepts also provide an operating method of a memory device equipped with a dual voltage line that consumes less power and/or has an operating margin secured.

However, example embodiments of Inventive concepts are not restricted to those set forth herein. The above and other example embodiments of Inventive concepts will become more apparent to one of ordinary skill in the art to which Inventive concepts pertains by referencing the detailed description of Inventive concepts given below.

According to some aspects of inventive concepts, there is provided a memory device comprising a memory cell configured to store data based on a first voltage, a row decoder configured to select a wordline of the memory cell based on the first voltage, and a wordline predecoder configured to generate a "predec" signal associated with generating a wordline voltage to be provided to the row decoder. The wordline predecoder is configured to be driven by the first voltage and by a second voltage which is different from the first voltage, configured to receive a row address signal associated with selecting the wordline, and to receive an internal clock signal associated with adjusting operating timings of elements included in the memory device, configured to perform a NAND operation on the row address signal and the internal clock signal, and configured to provide the "predec" signal generated based on a result of the NAND operation to the row decoder.

According to some aspects of inventive concepts, there is provided a memory device comprising a static random-access memory (SRAM) cell connected to a wordline and a bitline, a wordline driver configured to provide a wordline voltage having a first voltage to the wordline, a bitline precharge circuit configured to provide a bitline voltage having a second voltage, which is lower than the first voltage, to the bitline, and a wordline predecoder configured to generate a "predec" signal, which is associated with enabling the wordline voltage. The wordline predecoder includes a pull-up transistor, which is configured to pull up the "predec" signal based on a first control signal having the first voltage, and a first pull-down transistor, which is configured to pull down the "predec" signal based on a second control signal having the second voltage.

According to some aspects of inventive concepts, there is provided an operating method of a memory device comprising allowing an internal clock signal to transition from a first level to a second level, in response to the internal clock signal transitioning to the second level, allowing a bitline precharge voltage to rise from the first level to the second level at a first time, and in response to the internal clock signal transitioning to the second level, allowing a wordline voltage to rise from the first level to a third level, which is greater than the second level, at a second time, which is later than the first time.

Other features and example embodiments may be apparent from the following detailed description, the drawings, and the claims.

BRIEF DESCRIPTION OF THE DRAWINGS

The above and other embodiments and features of inventive concepts will become more apparent by describing in detail embodiments thereof with reference to the attached drawings, in which.

DETAILED DESCRIPTION OF SOME EXAMPLE EMBODIMENTS

Some example embodiments of inventive concepts will hereinafter be described with reference to the accompanying drawings.

Figure 1:
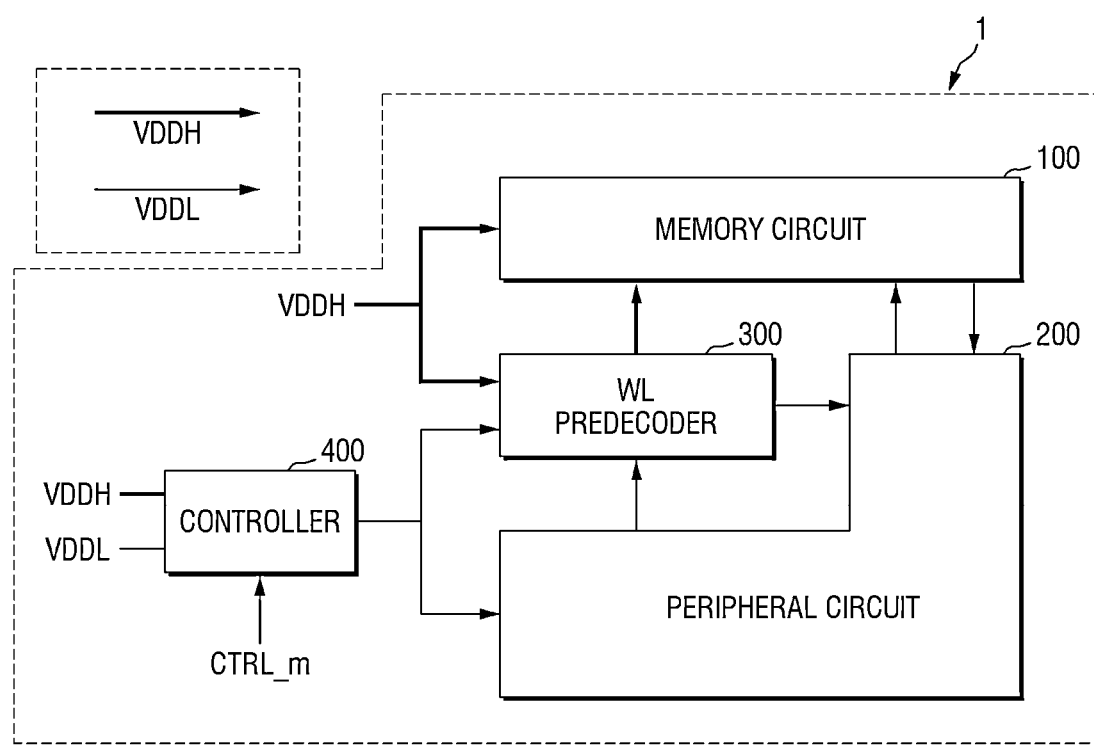
FIG. 1 is a block diagram of a memory device equipped with a dual voltage line, according to some embodiments of inventive concepts.

FIG. 1 is a block diagram of a memory device equipped with a dual voltage line, according to some embodiments of inventive concepts.

Referring to FIG. 1, a memory device 1 may include a memory circuit 100, a peripheral circuit 200, a wordline predecoder 300, and a controller 400. A dual voltage including a first voltage VDDH and a second voltage VDDL, which is lower than/less than (less in absolute value than) the first voltage VDDH and a third voltage (e.g., a ground voltage), may be provided to the memory device 1. The first voltage VDDH may be provided to the memory circuit 100, and the first or second voltage VDDH or VDDL may be selectively provided to the peripheral circuit 200 and the precoder circuit 300, for example depending on the operation mode of the memory device 1.

In a case where the memory device 1 is set to a high-speed operation mode, the controller 400 may select the first voltage VDDH from among the first and second voltages VDDH and VDDL based on an operation mode control signal CTRL_m, and may provide the first voltage VDDH to the peripheral circuit 200 and the wordline predecoder 300. Alternatively, in a case where the memory device 1 is set to a low-speed operation mode (or a low-power operation mode), the controller 400 may select the second voltage VDDL from between the first and second voltages VDDH and VDDL based on the operation mode control signal CTRL_m, and may provide the second voltage VDDL to the peripheral circuit 200 and the wordline predecoder 300.

The operating speed of the memory device 1, which is provided with a double voltage line, can be increased by applying a relatively high voltage (e.g., the first voltage VDDH), and the power consumption of the memory device 1 can be reduced by applying a relatively low voltage (e.g., the second voltage VDDL). For example, the voltage applied to the memory device 1 may be selectively controlled depending on the purpose of use of the memory device 1.

However, in a case where the memory device 1 is set to the lower-power operation mode (e.g. the low-speed operation mode), a timing skew may be generated due to the difference between the first voltage VDDH, applied to the memory circuit 100, and the second voltage VDDL, applied to the peripheral circuit 200. In this case, an additional circuit for compensating for the timing skew may be needed, resulting in an increase in performance overhead.

Figure 2:
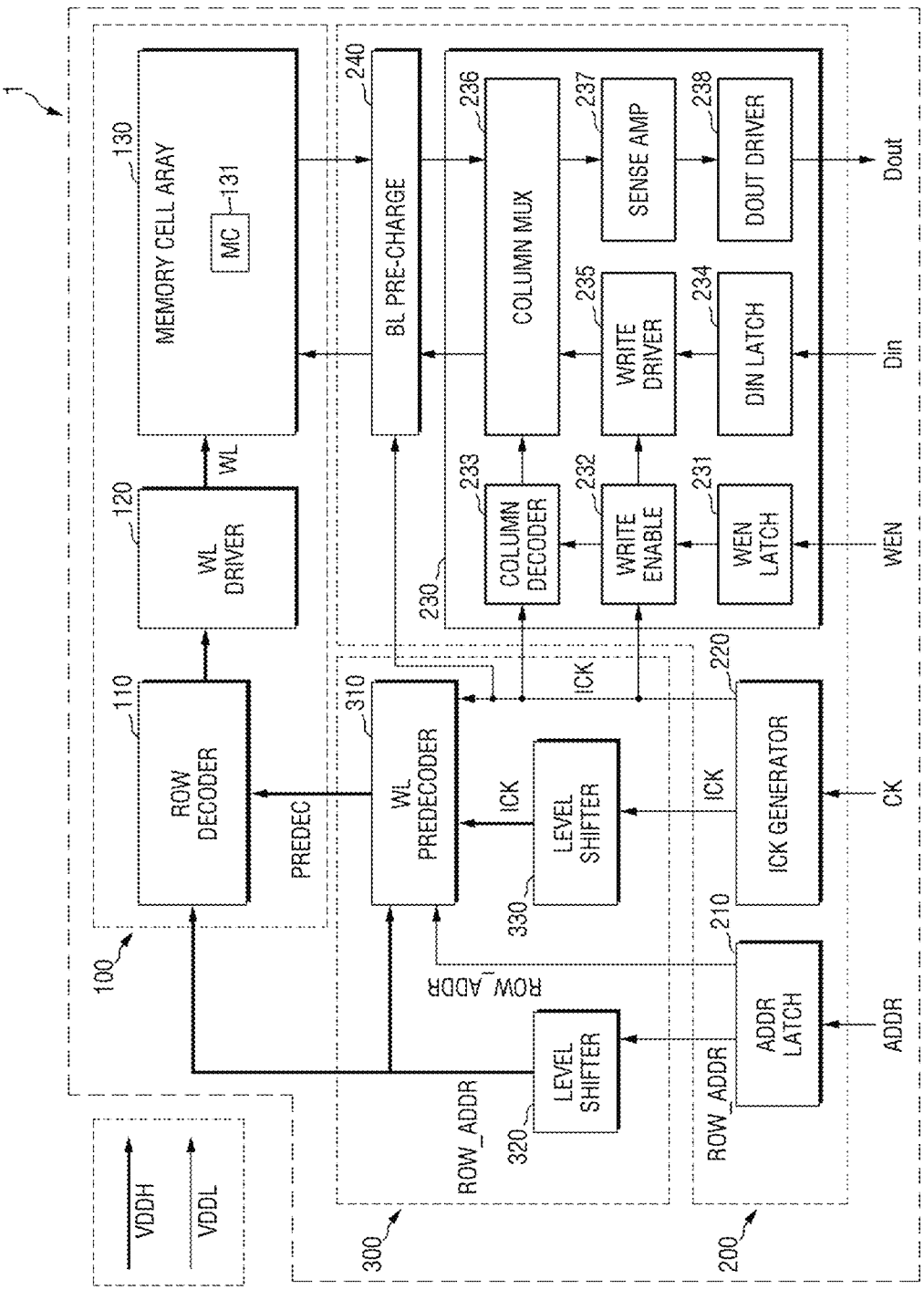
FIG. 2 is a block diagram of the memory device.

FIG. 2 is a block diagram of the memory device 1.

Referring to FIG. 2, the memory circuit 100 may include a row decoder 110, a wordline driver ("WL DRIVER") 120, and a memory cell array 130. The row decoder 110 may receive a row address signal ROW_ADDR and a "predec" signal PREDEC, e.g. from the outside. The row decoder 110 may apply a wordline voltage WL to a wordline driver for selecting a wordline based on the "predec" signal PREDEC. The structure of the row decoder 110 will be described later. The wordline driver 120 may be connected to the memory cell array 130 through a plurality of wordlines (e.g. rows). Under the control of the row decoder 110, the wordline driver 120 may select one of a plurality of wordlines (not illustrated) included in the memory cell array 130 based on the row address ROW_ADDR. Also, the wordline driver 120 may apply the wordline voltage WL to the selected wordline. Here, the wordline voltage WL may include a read wordline voltage and a write wordline voltage that may or may not be the same as each other. The read wordline voltage and/or the write wordline voltage may be greater than a threshold voltage of transistors included in cells 131 that are included in the memory cell array 130. The memory cell array 130 may be connected to the wordline driver 120 through the wordlines and may be connected to a column multiplexer 236 through a plurality of bitlines. The memory cell array 130 may include a memory cell 131, which is connected to the wordlines and the bitlines. The memory cells 131 may be (or may include) a static random access memory (SRAM) cell including, for example, two (cross-coupled) inverters, but inventive concepts are not limited thereto. The SRAM cell may be or may include a six-transistor (6T) cell; however, example embodiments are not limited thereto, and the SRAM cell may be or may include other configurations such as but not limited to a 4T cell, or an 8T cell. FIG. 2 illustrates the memory cell array 130 as including only one memory cell 131, but inventive concepts are not limited thereto. For example, the memory cell array 130 may include more than one memory cell 131, and may be arranged in an array, e.g. a rectangular (or square) array of rows and columns.

The peripheral circuit 200 may include an address latch ("ADDR LATCH") 210, an internal clock signal generator ("ICK GENERATOR") 220, a data read/write circuit 230, and a bitline precharge circuit 240. The address latch 210 may receive an address signal ADDR generated by a control circuit (not illustrated) and may provide a row address signal ROW_ADDR to the wordline predecoder 300 and to the row decoder 110. Examples of the row address signal ROW_ADDR may include a high (large) row address signal and a low (small) row address signal. The wordline predecoder 310 may receive the low row address signal, may convert the low row address signal into a "predec" signal PREDEC, and may output the "predec" signal PREDEC to the row decoder 110. The row decoder 110 may receive the high row address signal and the "predec" signal PREDEC and may generate the wordline voltage WL, which is for selecting one of the wordlines, based on the high row address signal and on the "predec" signal PREDEC. The internal clock signal generator 220 may receive a clock signal from the control circuit and may generate an internal clock signal ICK. The internal clock signal generator 220 may provide the internal clock signal ICK to each of or some of the elements and/or the circuits of the memory device 1 to adjust the operation timings of the elements and/or the circuits of the memory device 1.

The data read/write circuit 230 may write data Din, which is provided by an external circuit, block, and/or device, to the memory cell 131, connected to a wordline and at least one bitline pair selected by the control circuit. Alternatively or additionally, the data/write circuit 230 may read data Dout from the memory cell 131 and may provide the data Dout to the external circuit, block, or device. For example, the data read/write circuit 340 may include a write enable latch 231, which receives a write enable signal WEN, a write enable circuit 232, which provides the write enable signal WE from the write enable latch 231 to a column decoder 233 and a write driver 235, and the column decoder 233, which controls the column multiplexer 236 based on the write enable signal WEL. Also, the data read/write circuit 340 may include a data latch 234, which receives the data Din from the external circuit, block, or device, the write driver 235, which writes the data Din to the memory cell array 130, the column multiplexer 236, which selects at least one bitline pair, a sense amplifier 237, which senses the data Dout stored in the memory cell 131, and a data driver 238, which provides the data Dout sensed by the sense amplifier 237 to the external circuit, block, or device. A bitline precharge circuit 240 may precharge the bitline pair selected by the control circuit.

The memory cell array 130 may include other cells, for example redundancy cells (not illustrated). There may be a redundancy check circuit (not illustrated) connected to either or both of the row decoder 110 and the column decoder 233. The redundancy check circuit may determine and/or reroute the row address ROW_ADDR and/or the column address COL_ADDR based on a check of redundancy.

The wordline predecoder 300 may include a wordline predecoder ("WL PREDECODER") 310, a first level shifter 320, and a second level shifter 330. The wordline predecoder 310 may receive the row address signal ROW_ADDR from the address latch 210, may receive the internal clock signal ICK from the internal clock signal generator 220, and may generate the "predec" signal PREDEC based on the row address signal ROW_ADDR and on the internal clock signal ICK. The first level shifter 320 may receive the row address signal ROW_ADDR from the address latch 210, may shift the level of the row address signal ROW_ADDR, and may provide the level-shifted row address signal ROW_ADDR to the wordline predecoder 310. The second level shifter 330 may receive the internal clock signal ICK from the internal clock signal generator 220, may shift the level of the internal clock signal ICK, and may provide the level-shifted internal clock signal ICK to the wordline predecoder 310. The wordline predecoder 310 may be connected to/directly connected to the address latch 210 and the internal clock signal generator 220 and may thus receive the row address signal ROW_ADDR and the internal clock signal ICK. For example, the wordline predecoder 310 may receive the level-shifted row address signal ROW_ADDR and the level-shifted internal clock signal ICK from the first and second level shifters 320 and 330. For example, the wordline predecoder 310 may receive a row address signal ROW_ADDR having the first or second voltage VDDH or VDDL and an internal clock signal ICK having the first or second voltage VDDH or VDDL. The wordline predecoder 310 will be described later in further detail.

The structure of the memory cell 131 and data read/write operations will hereinafter be described.

Figures 3, 4:
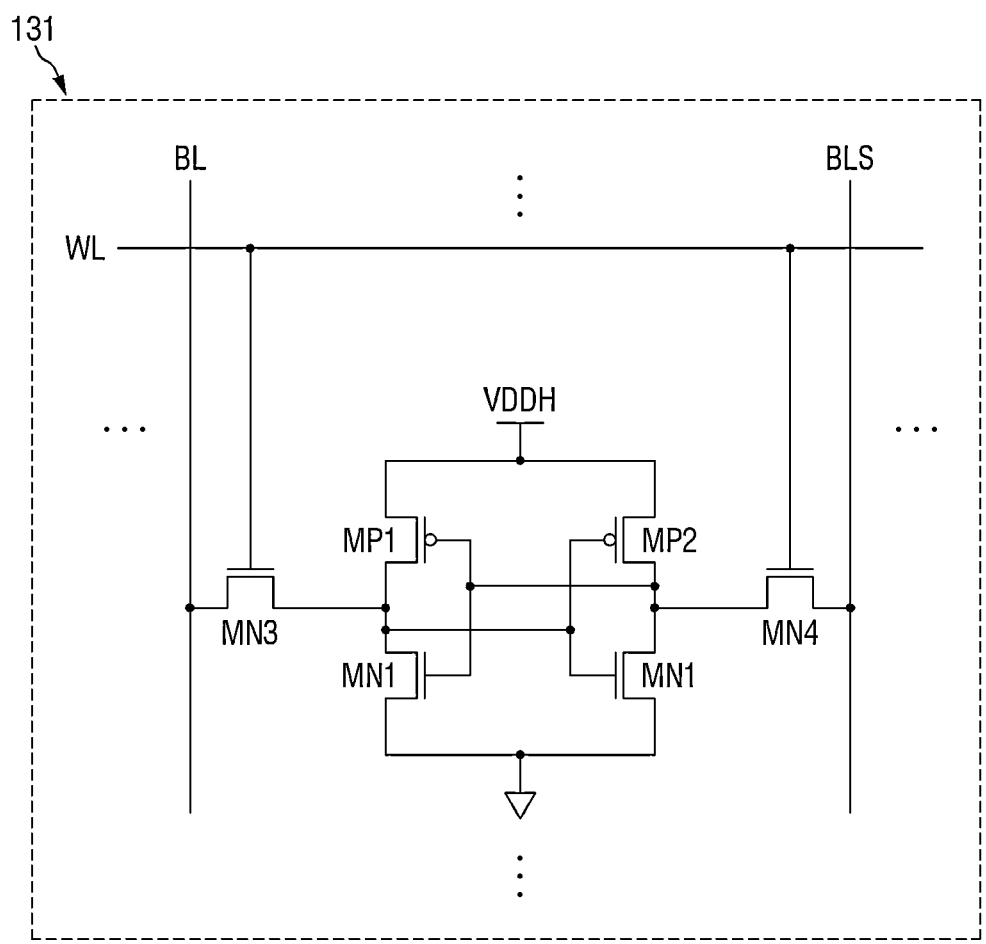
FIG. 3 is a circuit diagram of the memory cell of FIG. 2.
FIG. 4 illustrates the operation of the memory cell of FIG. 3.
Figure 5:
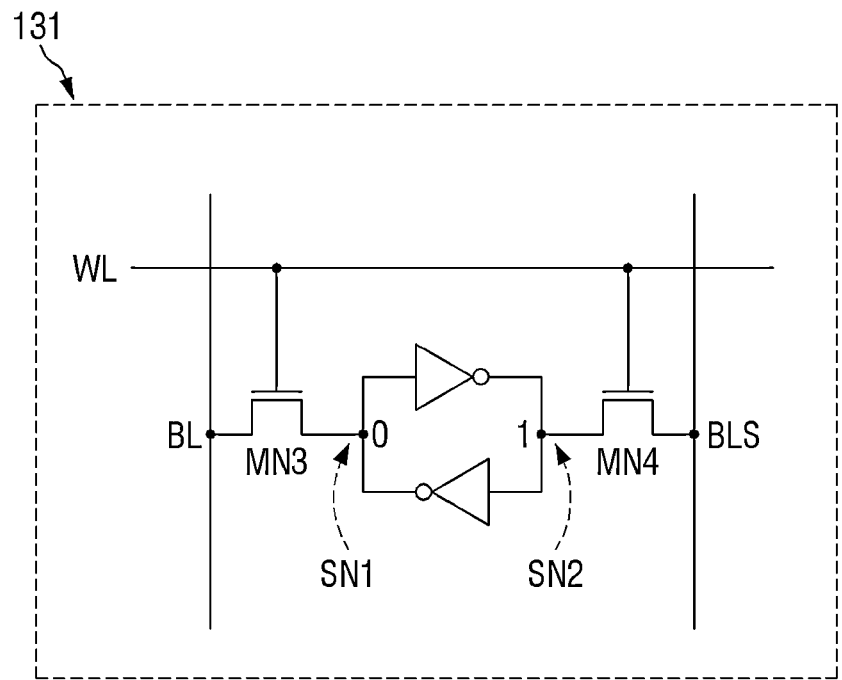
FIGS. 5 and 6 are circuit diagrams for explaining the operation of the memory cell of FIG. 3.
Figure 6:
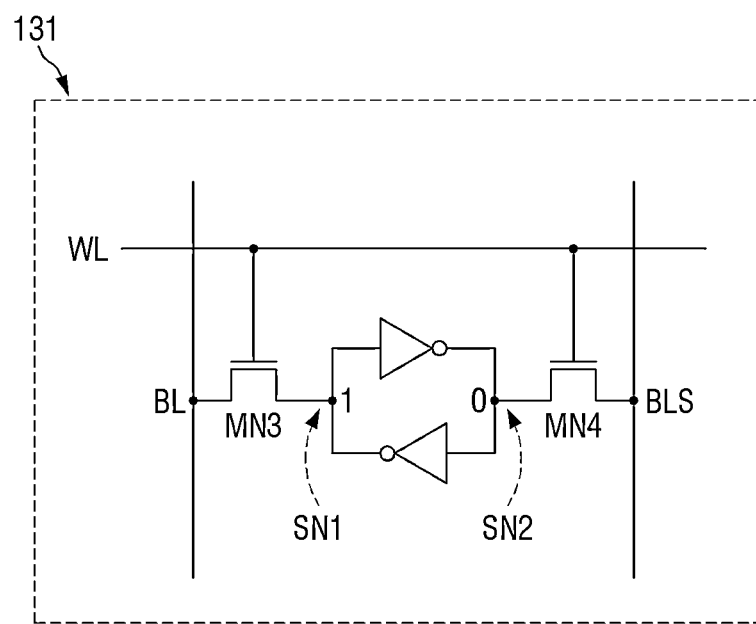

FIG. 3 is a circuit diagram of the memory cell 131 of FIG. 2. FIG. 4 illustrates the operation of the memory cell 131 of FIG. 3. FIGS. 5 and 6 are circuit diagrams for explaining the operation of the memory cell 131 of FIG. 3.

Referring to FIGS. 3, 5, and 6, the memory cell 131 may include a first inverter, which consists of or includes a first P-type metal-oxide-semiconductor (PMOS) transistor MP1, e.g. a first pullup transistor and a first N-type metal-oxide-semiconductor (NMOS) transistor MN1, e.g. a first pull-down transistor. The memory cell may include a second inverter, which consists of or includes a second PMOS transistor MP2 (a second pullup transistor) and a second NMOS transistor MN2 (a second pulldown transistor). The memory cell may further include third and fourth NMOS transistors MN3 and MN4, e.g. first and second passgate transistors, which receive a wordline voltage as a gate voltage and function as switches. The memory cell 131 may use the first voltage VDDH as a cell voltage. For example, the first voltage VDDH is provided to the common source of the first and second PMOS transistors MP1 and MP2. Thus, the memory cell 131 may be supplied with the first voltage VDDH, which is higher than (greater than) the second voltage VDDL, regardless of the operation mode of the memory device 1. The first and second inverters may form a latch circuit, and the latch circuit may receive the first voltage VDDH and may maintain data with the first voltage VDDH. FIG. 3 illustrates the third and fourth NMOS transistors MN3 and MN4 as being turned on by a wordline voltage V_WL having a first level (e.g., a high level) which may be greater than a threshold voltage of third and fourth NMOS transistors MN3 and MN4, but inventive concepts are not limited thereto. For example, the first and fourth NMOS transistors may be configured to be turned on by a wordline voltage having a third level (e.g., a low level), which may be greater than a threshold voltage of the third and fourth NMOS transistors MN3 and MN4.

The operation of the memory cell 131 will hereinafter be described with reference to FIGS. 4 through 6. FIG. 4 shows example data stored in the memory cell 131, for explaining the operation of the memory cell 131. Referring to FIG. 4, a data value of logic "0" may be stored in the memory cell 131 when the voltage at a first node SN1 of the memory cell 131 has a low level and the voltage at a second node SN2 of the memory cell 131 has a high level. A data value of logic "1" may be stored in the memory cell 131 when the voltage at the first node SN1 has a high level and the voltage at the second node SN2 has a low level. However, inventive concepts are not limited to this. Alternatively, the data value of "0" may be stored in the memory cell 131 when the voltage at the first node SN1 has a high level and the voltage at the second node SN2 has a low level.

Referring to FIGS. 5 and 6, a latch circuit consisting of or including a pair of inverters may store data. During a read operation for the memory cell 131, information indicating whether the memory cell 131 stores a data value of "0" or "1" is transmitted to an output terminal. For example, first and second bitlines BL and BLS (e.g. bitline true and bitline complimentary) are precharged to a predetermined or variable determined voltage. The value of a wordline signal of the memory cell 131 becomes "1" so that the first and second nodes SN1 and SN2 of the memory cell 131 are connected to the first and second bitlines BL and BLS, respectively.

Then, the voltages of the first and second bitlines BL and BLS change in accordance with the data stored in the memory cell 131. Then, a voltage difference ΔV between the first and second bitlines B11 and BLS is sensed and amplified by the sense amplifier 237, and the result of the sensing is transmitted to the data driver 238. In this manner, the read operation for the memory cell 131 is performed.

Once the read operation for the memory cell 131 begins, the value of the wordline signal of the memory cell 131 becomes "1". For example, in a case where the value of the wordline signal of the memory cell 131 becomes "1" and the read operation for the memory cell 131 is being performed, a cell current from the first bitline BL flows into the memory cell 131 so that the voltage of the first bitline BL decreases and the voltage of the second bitline BLS increases. For example, there may be a splitting of rails between the first bitline BL and the second bitline BLS. As a result, the voltage difference ΔV arises between the first and second bitlines BL and BLS and is transmitted to the sense amplifier 237. Then, the sense amplifier 237 performs a sensing operation. The sensing operation of the sense amplifier 237 is performed by the voltage difference ΔV, and the sense amplifier 237 senses which of the voltages of the first and second bitlines BL and BLS has decreased, and transmits a digital data value of "0" or "1" to the data driver 237 based on the result of the sensing. However, inventive concepts are not limited to this.

The structure of the row decoder 110 will hereinafter be described with reference to FIG. 7.

Figure 7:
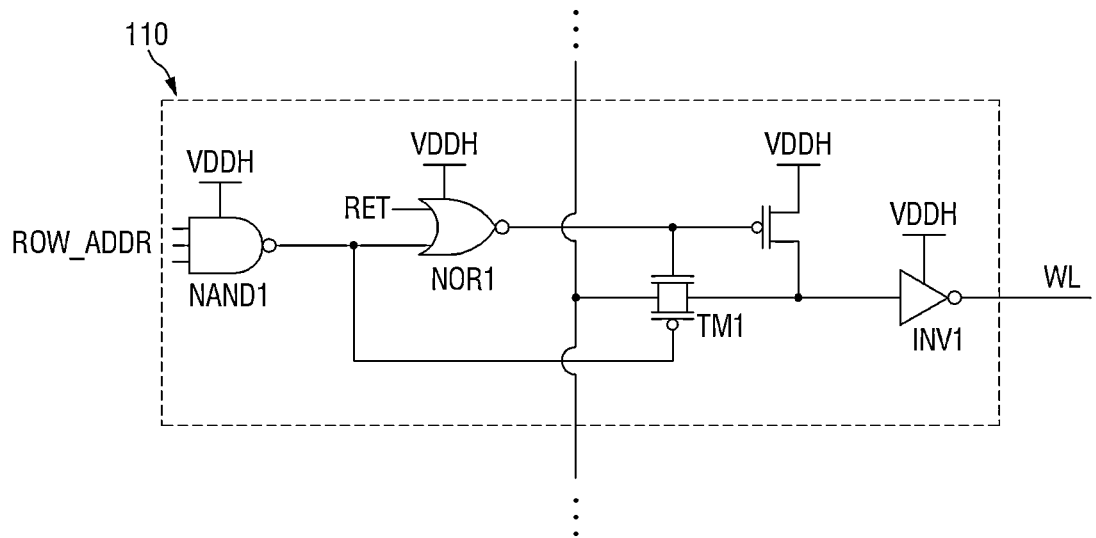
FIG. 7 is a circuit diagram of the row decoder of FIG. 2.

FIG. 7 is a circuit diagram of the row decoder of FIG. 2.

Referring to FIG. 7, the row decoder 110 includes a first NAND gate NAND1, which receives the row address signal ROW_ADDR as an input signal, a second NOR gate NOR1, which receives the output of the first NAND gate NAND1 as and a retention signal RET as input signals, a first transmission gate TM1, which receives the "predec" signal PREDEC as an input signal and outputs a decoding signal, and a first inverter INV1, which is connected to a final output terminal. The row address signal ROW_ADDR input to the first NAND gate NAND1 of the row decoder 110 may be a high (or large) row address signal. The retention signal RET may reduce power consumption by blocking the power of the peripheral circuit 200 in accordance with the operation of the memory cell 131. FIG. 7 illustrates only one row decoder 110, but the number of row decoders 110 is not particularly limited. For example, as many row decoders as there are wordlines may be provided.

Figure 8:
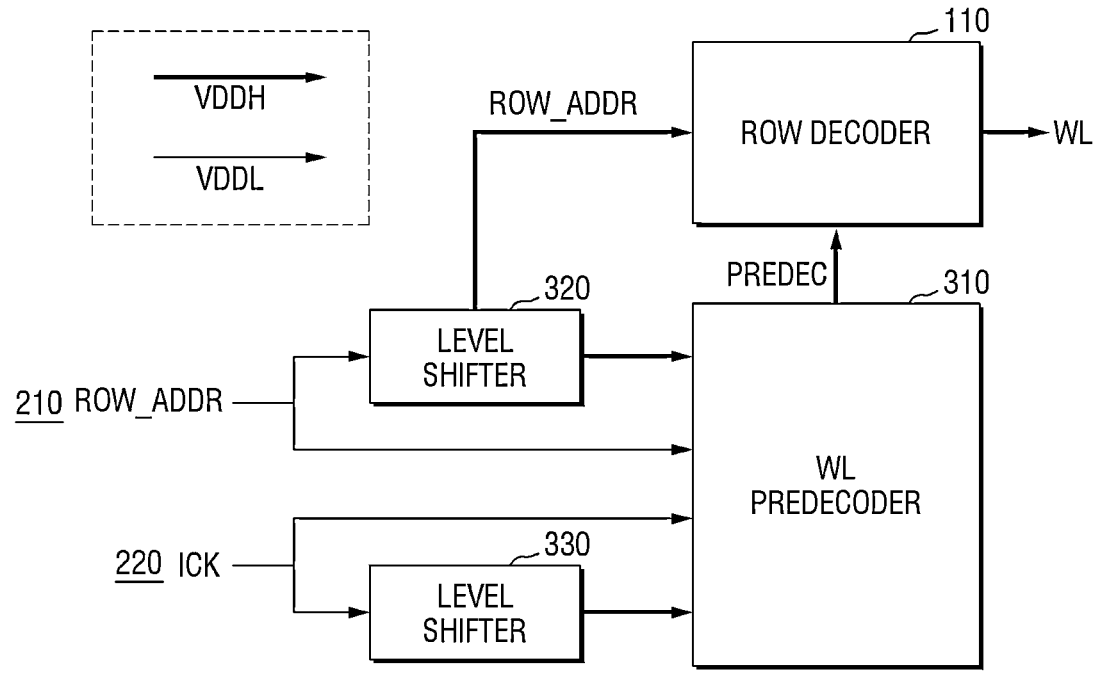
FIG. 8 is a block diagram for explaining the wordline predecoder.

FIG. 8 is a block diagram for explaining the wordline predecoder 310, to which a dual voltage is provided.

Referring to FIG. 8, each of the row address signal ROW_ADDR and the internal clock signal ICK may be provided to the wordline predecoder 310 as a dual voltage consisting of or including the first and second voltages VDDH and VDDL. A row address signal ROW_ADDR having the second voltage VDDL may be provided from the address latch 210 to the wordline predecoder 310, and a row address signal ROW_ADDR level-shifted from the second voltage VDDL to the first voltage VDDH by the first level shifter 320 may be provided to the wordline predecoder 310. Similarly, an internal clock signal ICK having the second voltage VDDL may be provided from the internal clock signal generator 220 to the wordline predecoder 310, and an internal clock signal ICK level-shifted from the second voltage VDDL to the first voltage VDDH by the second level shifter 330 may be provided to the wordline predecoder 310.

The operation of the wordline predecoder 310, to which a dual voltage is provided, will hereinafter be described.

Figure 9:
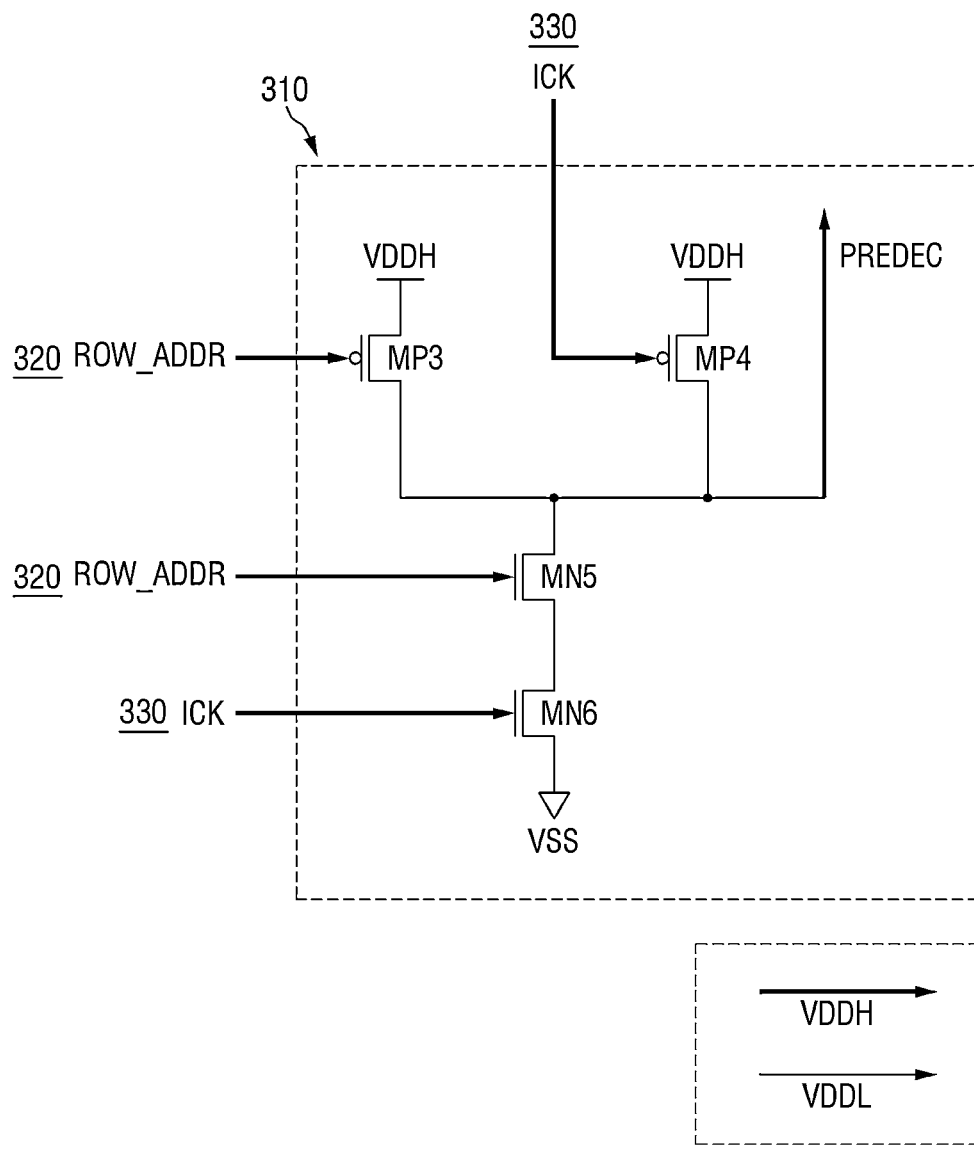
FIG. 9 is a circuit diagram for explaining the operation of the wordline predecoder when the memory device is set to a high-speed operation mode.

FIG. 9 is a circuit diagram for explaining the operation of the wordline predecoder 310 when the memory device 1 is set to a high-speed operation mode.

Referring to FIG. 9, the wordline predecoder 310 may include a third PMOS transistor MP3, a fourth PMOS transistor MP4, a fifth NMOS transistor MN5, and a sixth NMOS transistor MN6. The first voltage VDDH may be provided to the sources of the third and fourth PMOS transistors MP3 and MP4. The drains of the third and fourth PMOS transistors MP3 and MP4 may be electrically connected (e.g. directly connected) to each other. The third and fourth PMOS transistors MP3 and MP4 may receive a row address signal ROW_ADDR having the first voltage VDDH and an internal clock signal ICK having the first voltage VDDH as respective gate voltages. For example, the third and fourth PMOS transistors MP3 and MP4 may form an OR logic circuit that performs an OR operation. The OR logic circuit may output the "predec" signal PREDEC as the first voltage VDDH based on the result of the OR operation.

The drain of the fifth NMOS transistor MN5 may be connected to the source of the sixth NMOS transistor MN6, and a third voltage VSS may be connected to the drain of the sixth NMOS transistor MN6. The fifth NMOS transistor MN5 may receive the row address signal ROW_ADDR having the first voltage VDDH as a gate voltage, and the sixth NMOS transistor MN6 may receive the internal clock signal ICK having the first voltage VDDH as a gate voltage. For example, the fifth and sixth NMOS transistors MN5 and MN6 may form an AND logic circuit that performs an AND operation. The AND logic circuit may ground the "predec" signal PREDEC to a low value, e.g. as low as the third voltage VSS based on the result of the AND operation.

Referring to FIG. 9, in a case where the memory device 1 is operating in a high-speed operation mode, the row address signal ROW_ADDR having the first voltage VDDH and the internal clock signal ICK having the first voltage VDDH are provided to the gates of the third and fourth PMOS transistors MP3 and MP4, respectively and the gates of the fifth and sixth NMOS transistors MN5 and MN6, respectively. Also, the row address signal ROW_ADDR having the first voltage VDDH and the internal clock signal ICK having the first voltage VDDH are provided to the respective gates of the fifth and sixth NMOS transistors MN5 and MN6. In this case, as signals having a relatively high voltage (e.g., the first voltage VDDH) are provided to both the gates of the third and fourth PMOS transistors MP3 and MP4 and the gates of the fifth and sixth NMOS transistors MN5 and MN6, the amount of time taken to connect (e.g. turn on) and disconnect (e.g. turn off) the source and drain of each of the third and fourth PMOS transistors MP3 and MP4 and the source and drain of each of the fifth and sixth NMOS transistors MN5 and MN6 may be reduced. Thus, the operating speed of the memory device 1 can be improved.

For example, the internal clock signal ICK provided to the gate of the fourth PMOS transistor MP4 may be generated from the second level shifter 330, while the row address ROW_ADDR provided to the gate of the third PMOS transistor MP3 may be generated from the first level shifter 320. Furthermore, the internal clock signal ICK provided to the gate of the sixth NMOS transistor MN6 may be generated from the first level shifter 320, while the row address ROW_ADDR provided to the gate of the fifth NMOS transistor MN5 may be generated from the second level shifter 330.

Figure 10:
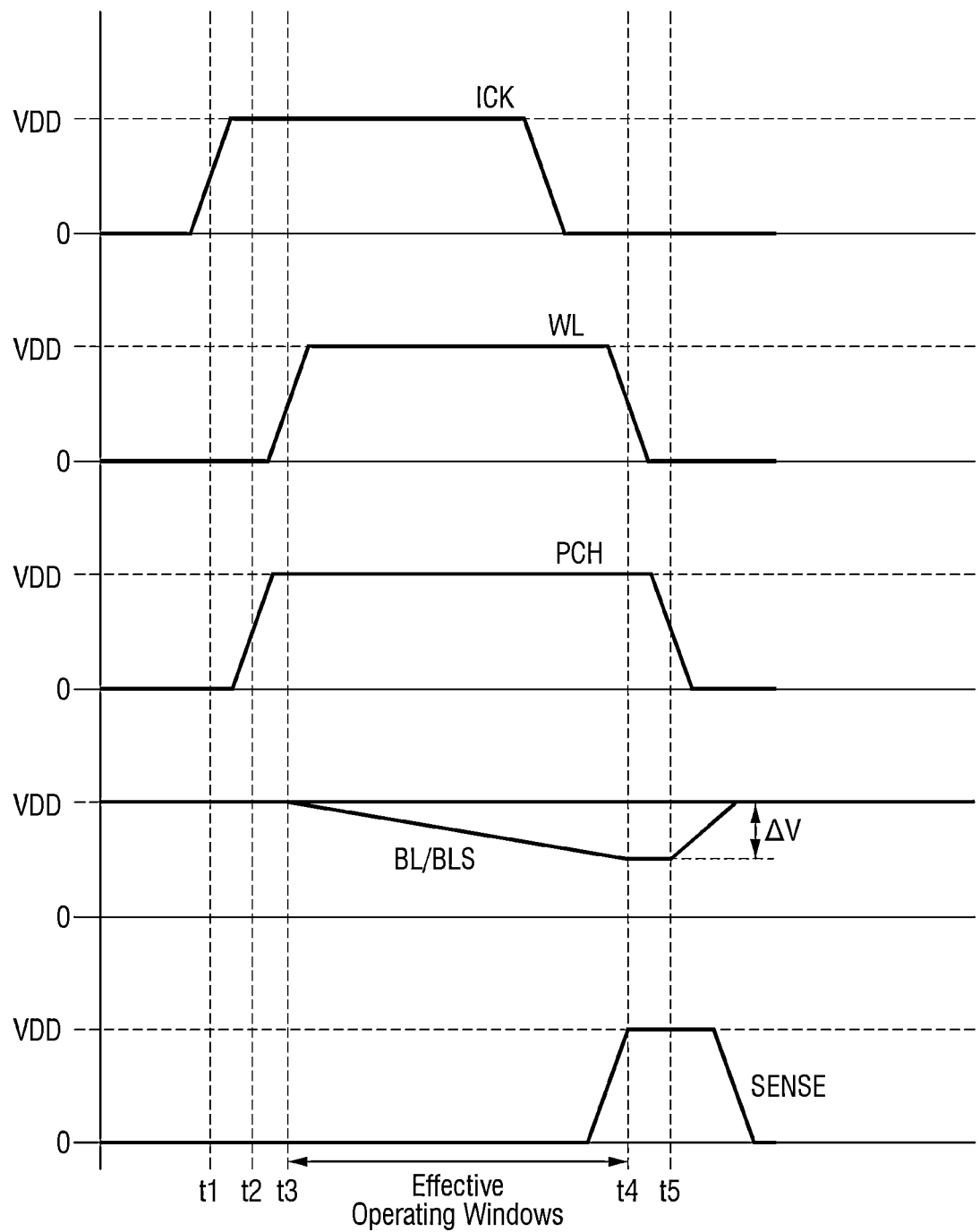
FIG. 10 is a timing diagram for explaining the operation of the memory device according to the embodiment of FIG. 9.

FIG. 10 is a timing diagram for explaining the operation of the memory device according to the embodiment of FIG. 9.

FIG. 10 illustrates the operation of the memory device 1, which is equipped with a dual voltage line, when a uniform predetermined voltage VDD is applied to the memory device 1. The voltage VDD may be one of a variety of voltages including the first and second voltages VDDH and VDDL.

Referring to FIG. 10, the internal clock signal ICK is output from the internal clock signal generator 220 at a time t1.

Thereafter, in response to the internal clock signal ICK being applied to the bitline precharge circuit 240, a bitline precharge voltage PCH rises to as high as the voltage VDD at a time t2.

In response to the internal clock signal ICK being applied to the wordline predecoder 310, the "predec" signal PREDEC is generated in the wordline predecoder 310 and is applied to the row decoder 110, the row decoder 110 selects one of the wordlines of the memory cell array 130 in response to the "predec" signal PREDEC. The wordline driver 120 applies the wordline voltage WL to the selected wordline so that the wordline voltage rises to as high as the voltage VDD at a time t3. As the wordline voltage WL needs to/is to pass through the wordline predecoder 310 and the row decoder 110 to be applied, the time t3 when the wordline voltage WL rises may come later than the time t2 when the bitline precharge voltage PCH rises.

Thereafter, the wordline voltage WL decreases back at a time t4, and the bitline precharge voltage PCH also decreases at a time t5. The pulse width of the wordline driving voltage WL may be (t4–t3), and the pulse width of the bitline precharge voltage PCH may be (t5–t2). As illustrated in FIG. 10, the pulse width of the wordline voltage WL may be smaller than the pulse width of the bitline precharge voltage PCH. The sense amplifier 237 may sense the voltage difference ΔV between the first and second bitlines BL and BLS, between the time t4 and the time t5.

If a single uniform voltage (e.g., the voltage VDD), rather than a dual voltage, is applied to the memory device 1, the bitline precharge voltage PCH rises and falls ahead of the wordline voltage WL, as illustrated in FIG. 10. Thus, a timing skew does not occur.

Figure 11:
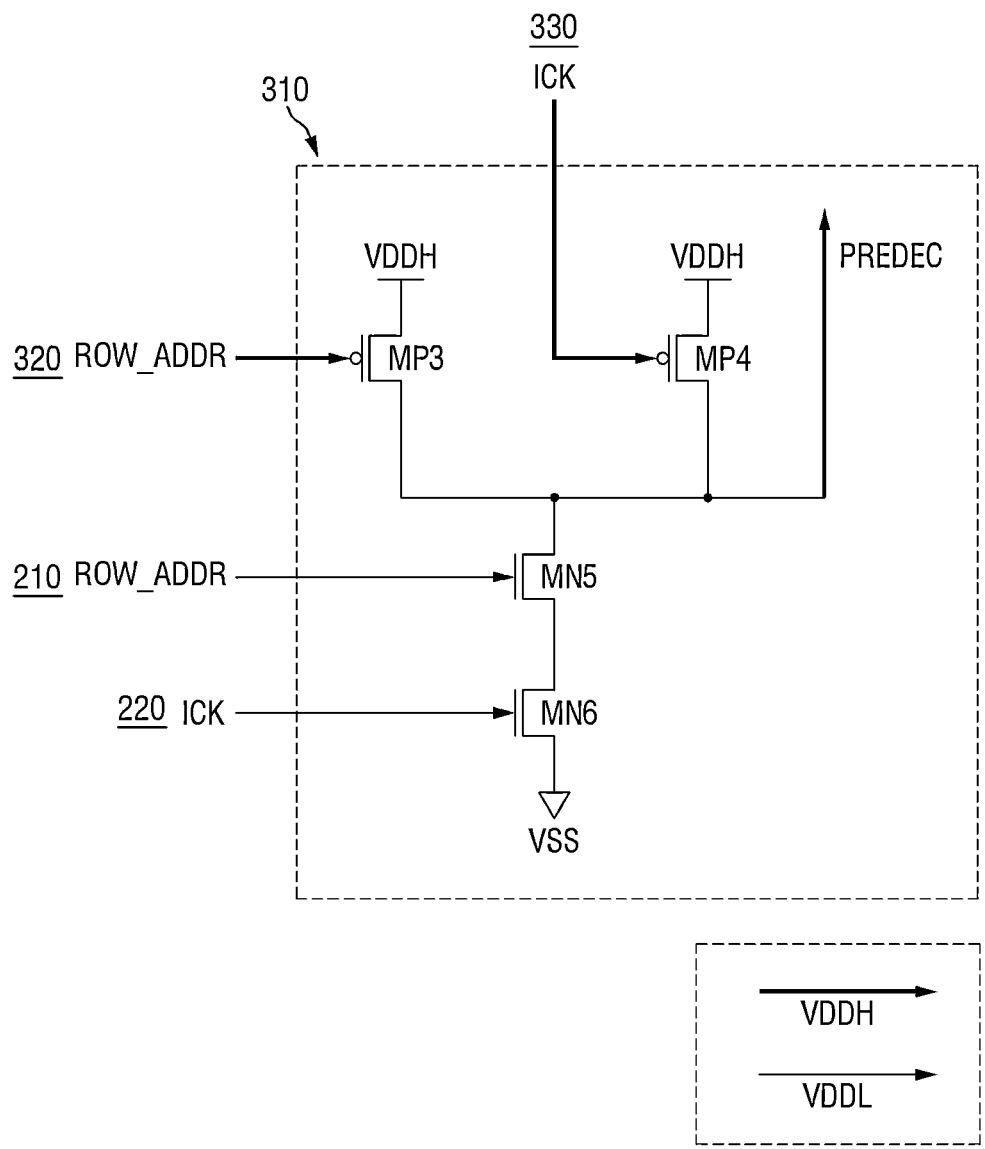
FIG. 11 is a circuit diagram for explaining the operation of the wordline predecoder when the memory device 1 is set to the low-power operation mode.

FIG. 11 is a circuit diagram for explaining the operation of the wordline predecoder 310 when the memory device 1 is set to the low-power operation mode.

Referring to FIG. 11, the wordline predecoder 310 may include the third PMOS transistor MP3, the fourth PMOS transistor MP4, the fifth NMOS transistor MN5, and the sixth NMOS transistor MN6. The first voltage VDDH may be provided to the sources of the third and fourth PMOS transistors MP3 and MP4. The drains of the third and fourth PMOS transistors MP3 and MP4 may be electrically connected to/directly connected to each other. The third and fourth PMOS transistors MP3 and MP4 may receive the row address signal ROW_ADDR having the first voltage VDDH and the internal clock signal ICK having the first voltage VDDH as their gate voltages. For example, the third and fourth PMOS transistors MP3 and MP4 may form an OR logic circuit that performs an OR operation. The OR logic circuit may output the "predec" signal PREDEC as the first voltage VDDH based on the result of the OR operation.

Alternatively, the drain of the fifth NMOS transistor MN5 may be connected to the source of the sixth NMOS transistor MN6, and the third voltage VSS may be connected to the drain of the sixth NMOS transistor MN6. The fifth NMOS transistor MN5 may receive the row address signal ROW_ADDR having the second voltage VDDL as a gate voltage, and the sixth NMOS transistor MN6 may receive the internal clock signal ICK having the second voltage VDDL as a gate voltage. For example, the fifth and sixth NMOS transistors MN5 and MN6 may form an AND logic circuit that performs an AND operation. The AND logic circuit may ground the "predec" signal PREDEC to as low as the third voltage VSS based on the result of the AND operation.

Referring to FIG. 11, in a case where the memory device 1 is in the low-power operation mode, the row address signal ROW_ADDR having the first voltage VDDH and the internal clock signal ICK having the first voltage VDDH are provided to the gates of the third and fourth PMOS transistors MP3 and MP4 and the gates of the fifth and sixth NMOS transistors MN5 and MN6. However, the row address signal ROW_ADDR having the second voltage VDDL and the internal clock signal ICK having the second voltage VDDL are provided to the gates of the fifth and sixth NMOS transistors MN5 and MN6 In this case, as signals having a relatively high voltage (i.e., the first voltage VDDH) are provided to the gates of the third and fourth PMOS transistors MP3 and MP4, the amount of time that it takes to connect (or turn on) and disconnect (or turn off) the source and drain of each of the third and fourth PMOS transistors MP3 and MP4 can be reduced. On the contrary, as signals having a relatively low voltage (i.e., the second voltage VDDL) are provided to the gates of the fifth and sixth NMOS transistors MN5 and MN6, the amount of time that it takes to connect (or turn on) and disconnect (or turn off) the source and drain of each of the third and fourth PMOS transistors MP3 and MP4 increases relatively. Thus, the operating speed of the memory device 1 may become slower in the low-speed operation mode than in the high-speed operation mode. However, as the second voltage VDDL, which is relatively low, is provided to the peripheral circuit 200, the power consumption of the memory device 1 can be reduced.

For example, the internal clock signal ICK provided to the gate of the fourth PMOS transistor MP4 may be generated from second level shifter 330, while the row address ROW_ADDR provided to the gate of the third PMOS transistor MP3 may be generated from the first level shifter 320. Furthermore, the internal clock signal ICK provided to the gate of the sixth NMOS transistor MN6 may be generated from the internal clock signal generator 220, while the row address ROW_ADDR provided to the gate of the fifth NMOS transistor MN5 may be generated from the address latch 210.

Figure 12:
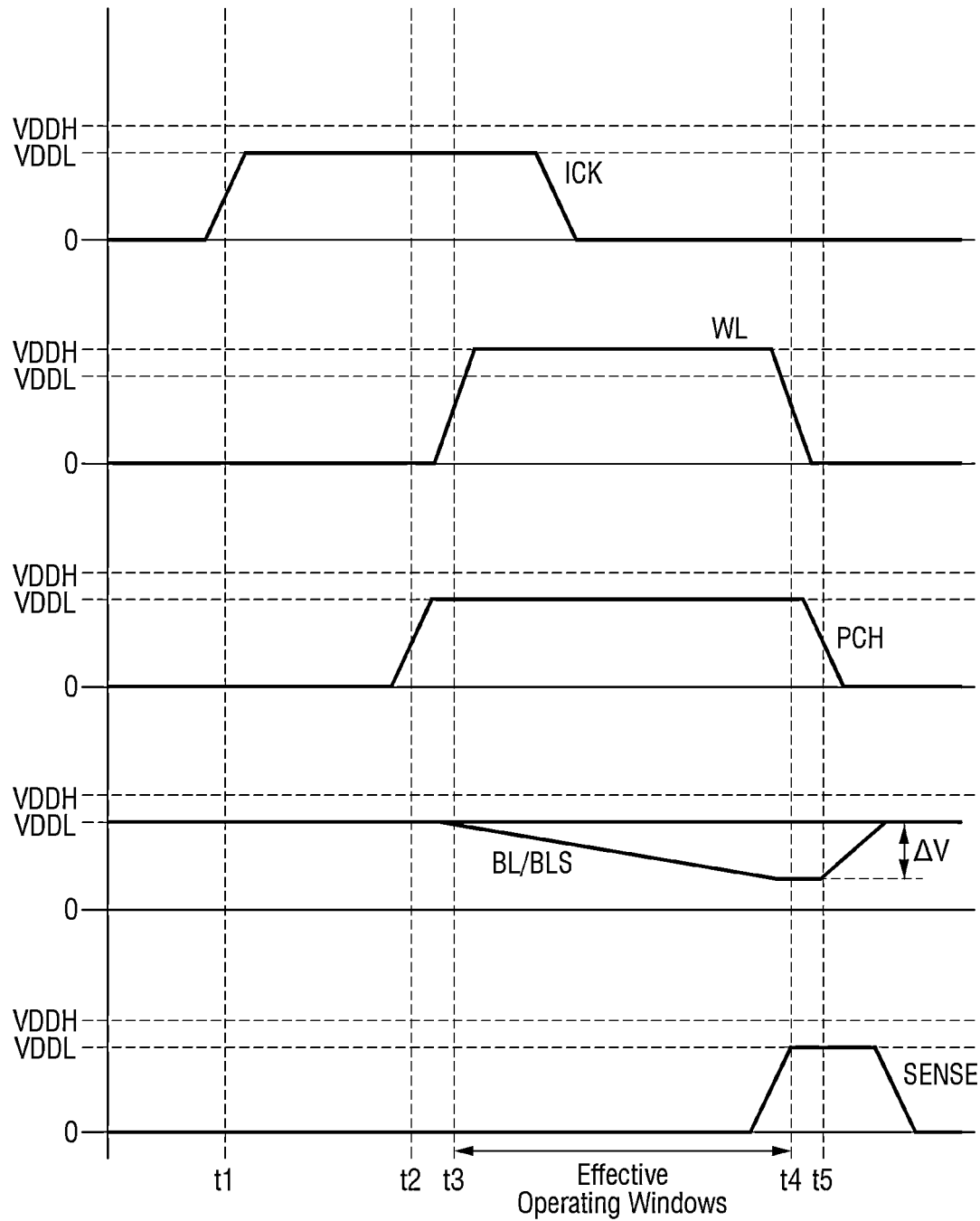
FIG. 12 is a timing diagram for explaining the operation of the memory device according to the embodiment of FIG. 11.

FIG. 12 is a timing diagram for explaining the operation of the memory device according to some example embodiments described with reference to FIG. 11.

The operation of the memory device 1 in a case where the memory device 1 is set to the low-power operation mode will hereinafter be described with reference to FIG. 12.

Referring to FIG. 12, the internal clock signal ICK is output from the internal clock signal generator 220 at a time t1.

Thereafter, in response to the internal clock signal ICK having the second voltage VDDL being applied to the bitline precharge circuit 240, the bitline precharge voltage PCH rises to as high as the second voltage VDDL at a time t2. The second voltage VDDL may be lower than the voltage VDD of FIG. 10. As already mentioned above, in a case where the voltage applied to the gate of a transistor becomes low, the turning on or off of the transistor may become slow. Thus, the time t2 may come later than its counterpart of FIG. 10.

In response to the internal clock signal ICK being applied to the wordline predecoder 310, the "predec" signal PREDEC is generated in the wordline predecoder 310 and is applied to the row decoder 110, the row decoder 110 selects one of the wordlines of the memory cell array 130 in response to the "predec" signal PREDEC, and the wordline driver 120 applies the wordline voltage WL to the selected wordline so that the wordline voltage rises to as high as the first voltage VDDH at a time t3. As already mentioned above, even when the memory device 1 is set to the low-power operation mode, the memory circuit 100 may operate at the first voltage VDDH, which is a relatively high voltage, to secure an operating margin. Thus, the transistors included in the memory circuit 100 may be turned on or off later than transistors operating at the second voltage VDDL. However, as the fifth and sixth NMOS transistors MN5 and MN6 of the wordline predecoder 310, which determine when to generate the "predec" signal PREDEC, operate at the second voltage VDDL, the "predec" signal PREDEC may be generated relatively late. Thus, the time t3 when the wordline voltage WL rises may still come later than the time t2 when the bitline precharge voltage PCH rises.

Thereafter, the wordline voltage WL decreases back at a time t4, and the bitline precharge voltage PCH also decreases at a time t5. The pulse width of the wordline driving voltage WL may be (t4-t3), and the pulse width of the bitline precharge voltage PCH may be (t5-t2). As illustrated in FIG. 12, the pulse width of the wordline voltage WL may be smaller than the pulse width of the bitline precharge voltage PCH. The sense amplifier 237 may sense and amplify the voltage difference ΔV between the first and second bitlines BL and BLS, between the time t4 and the time t5.

Even if a dual voltage (i.e., the first and second voltages VDDH and VDDL) is applied to the memory device 1, the bitline precharge voltage PCH rises ahead of the wordline voltage WL and falls later than the wordline voltage WL, as illustrated in FIG. 12. Thus, a timing skew does not occur.

Figure 13:
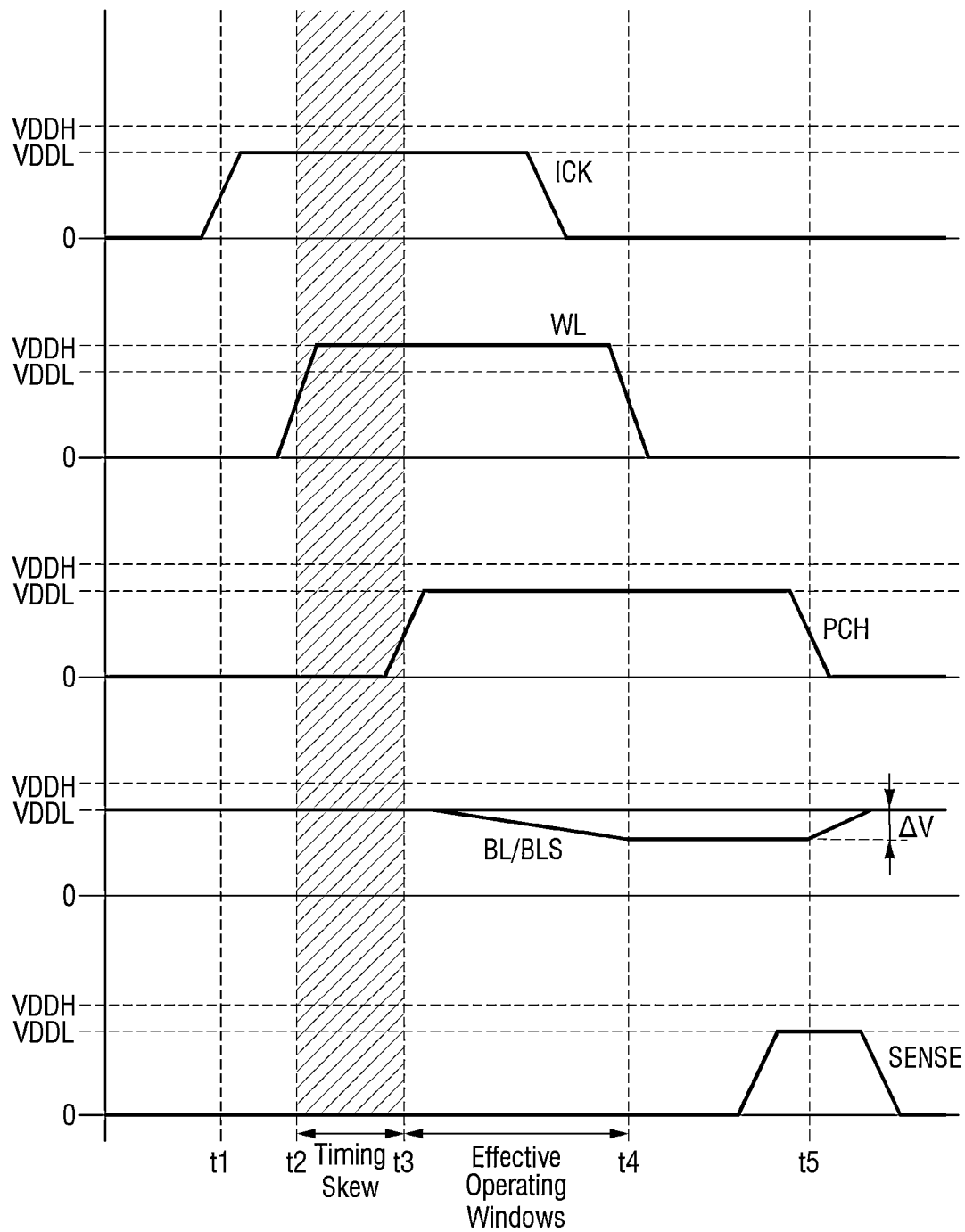
FIG. 13 is a timing diagram for explaining the operation of a memory device not including the wordline predecoder.

FIG. 13 is a timing diagram for explaining the operation of a memory device not including the wordline predecoder 310.

Referring to FIG. 13, in a memory device equipped with a double voltage line that does not include the wordline predecoder 310, an internal clock signal ICK is output from an internal clock signal generator 220 at a time t1.

Thereafter, a row decoder 110 selects one of a plurality of wordlines of a memory cell array 130 in response to the internal clock signal ICK, and a wordline driver 120 applies a wordline voltage WL to the selected wordline so that the wordline voltage WL rises to as high as a first voltage VDDH at a time t2.

In response to the internal clock signal ICK being applied to a bitline precharge circuit 240, a bitline precharge voltage PCH rises to as high as a second voltage VDDL at a time t3.

For example, in a case where the wordline predecoder 310 is not provided, the row decoder 110 and the wordline driver 120, which operate at the first voltage VDDH, are faster than the bitline precharge circuit 240, the time t2 when the wordline voltage WL rises may be earlier than the time t3 when the bitline precharge voltage PCH rises. In this case, a period of time when the wordline voltage WL rises to the first voltage VDDH but the bitline precharge voltage PCH is yet to rise up to the second voltage VDDL, e.g., a timing skew, may occur.

Thereafter, the wordline voltage WL decreases back at a time t4, and the bitline precharge voltage PCH also decreases at a time t5. The pulse width of the wordline driving voltage WL may be (t4-t2), and the pulse width of the bitline precharge voltage PCH may be (t5-t3). As illustrated in FIG. 13, the pulse width of the wordline voltage WL may be smaller than the pulse width of the bitline precharge voltage PCH. As the wordline voltage WL rises ahead of the bitline precharge voltage PCH, a timing skew may occur, and data cannot be read from, or written to, memory cells 131 during the timing skew. Thus, the effective operating window of the memory device 1 can be reduced.

A sufficient margin for the memory device 1 for a data read/write operation can be secured, and the operating reliability of the memory device 1 can be improved, as compared to a memory device not including the wordline predecoder 310.

The operation of a wordline predecoder of a memory device according to some embodiments of inventive concepts, to which a dual voltage is provided, will hereinafter be described.

Figure 14:
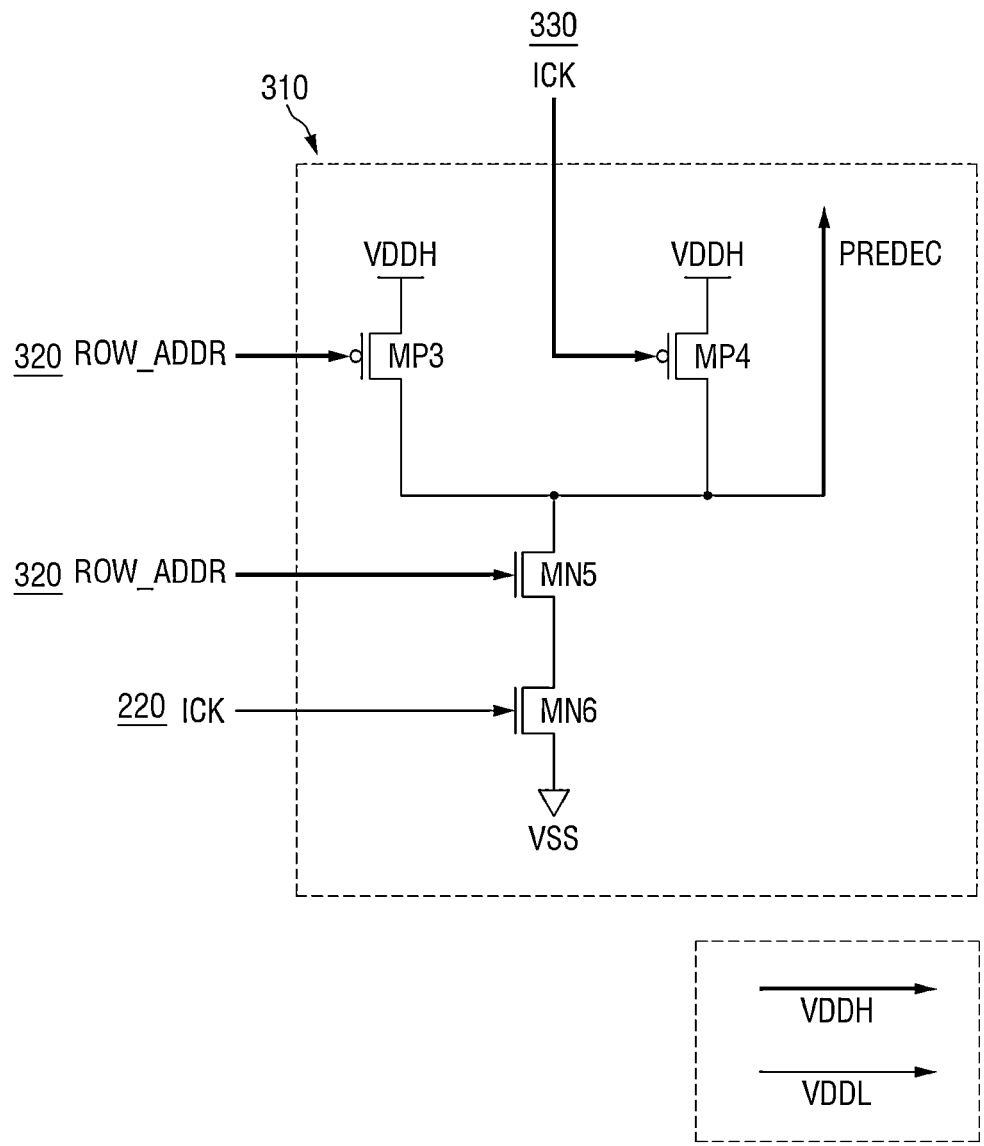
FIG. 14 is a circuit diagram for explaining the operation of a wordline predecoder of a memory device in a case where the memory device is set to a low-power operation mode.

FIG. 14 is a circuit diagram for explaining the operation of a wordline predecoder of a memory device according to some embodiments of inventive concepts in a case where the memory device is set to a low-power operation mode.

Referring to FIG. 14, a wordline predecoder 310 of a memory device 1 may include a third PMOS transistor MP3, a fourth PMOS transistor MP4, a fifth NMOS transistor MN5, and a sixth NMOS transistor MN6. A first voltage VDDH may be provided to the sources of the third and fourth PMOS transistors MP3 and MP4. The drains of the third and fourth PMOS transistors MP3 and MP4 may be electrically connected to each other. The third and fourth PMOS transistors MP3 and MP4 may receive a row address signal ROW_ADDR having the first voltage VDDH and an internal clock signal ICK having the first voltage VDDH as their gate voltages. That is, the third and fourth PMOS transistors MP3 and MP4 may form an OR circuit. The OR logic circuit may output the "predec" signal PREDEC as the first voltage VDDH based on the result of the OR operation.

However, the drain of the fifth NMOS transistor MN5 may be connected to the source of the sixth NMOS transistor MN6, and a third voltage VSS may be connected to the drain of the sixth NMOS transistor MN6. The fifth NMOS transistor MN5 may receive the row address signal ROW_ADDR having the first voltage VDDH as a gate voltage, and the sixth NMOS transistor MN6 may receive an internal clock signal ICK having a second voltage VDDL as a gate voltage. For example, the fifth and sixth NMOS transistors MN5 and MN6 may form an AND logic circuit that performs an AND operation. The AND logic circuit may ground the "predec" signal PREDEC to as low as the third voltage VSS based on the result of the AND operation.

Referring to FIG. 14, in a case where the memory device 1 is in the low-power operation mode, the row address signal ROW_ADDR having the first voltage VDDH and the internal clock signal ICK having the first voltage VDDH are provided to the gates of the third and fourth PMOS transistors MP3 and MP4 and the gate of the fifth NMOS transistor MN5. On the contrary, the internal clock signal ICK having the second voltage VDDL is provided to the gate of the sixth NMOS transistor MN6. In this case, as signals having a relatively high voltage (i.e., the first voltage VDDH) are provided to the gates of the third and fourth PMOS transistors MP3 and MP4 and the gate of the fifth NMOS transistor MN5, the amount of time that it takes to connect (e.g., turn on) and disconnect (e.g., turn off) the source and drain of each of the third and fourth PMOS transistors MP3 and MP4 and the fifth NMOS transistor MN5 can be reduced. However, as a signal having a relatively low voltage (e.g., the second voltage VDDL) is provided to the gate of the sixth NMOS transistor MN6, the amount of time that it takes to connect (or turn on) and disconnect (or turn off) the source and drain of the sixth NMOS transistor MN6 increases relatively. Thus, the operating speed of the memory device 1 may become slower in the low-speed operation mode than in the high-speed operation mode. However, as the second voltage VDDL, which is relatively low, is provided to a peripheral circuit 200, the power consumption of the memory device 1 can be reduced.

For example, the internal clock signal ICK provided to the gate of the fourth PMOS transistor MP4 may be generated from second level shifter 330, while the row address ROW_ADDR provided to the gate of the third PMOS transistor MP3 may be generated from the first level shifter 320. Furthermore, the internal clock signal ICK provided to the gate of the sixth NMOS transistor MN6 may be generated from the first level shifter 320, while the row address ROW_ADDR provided to the gate of the fifth NMOS transistor MN5 may be generated from the internal clock signal generator 220.

Figure 15:
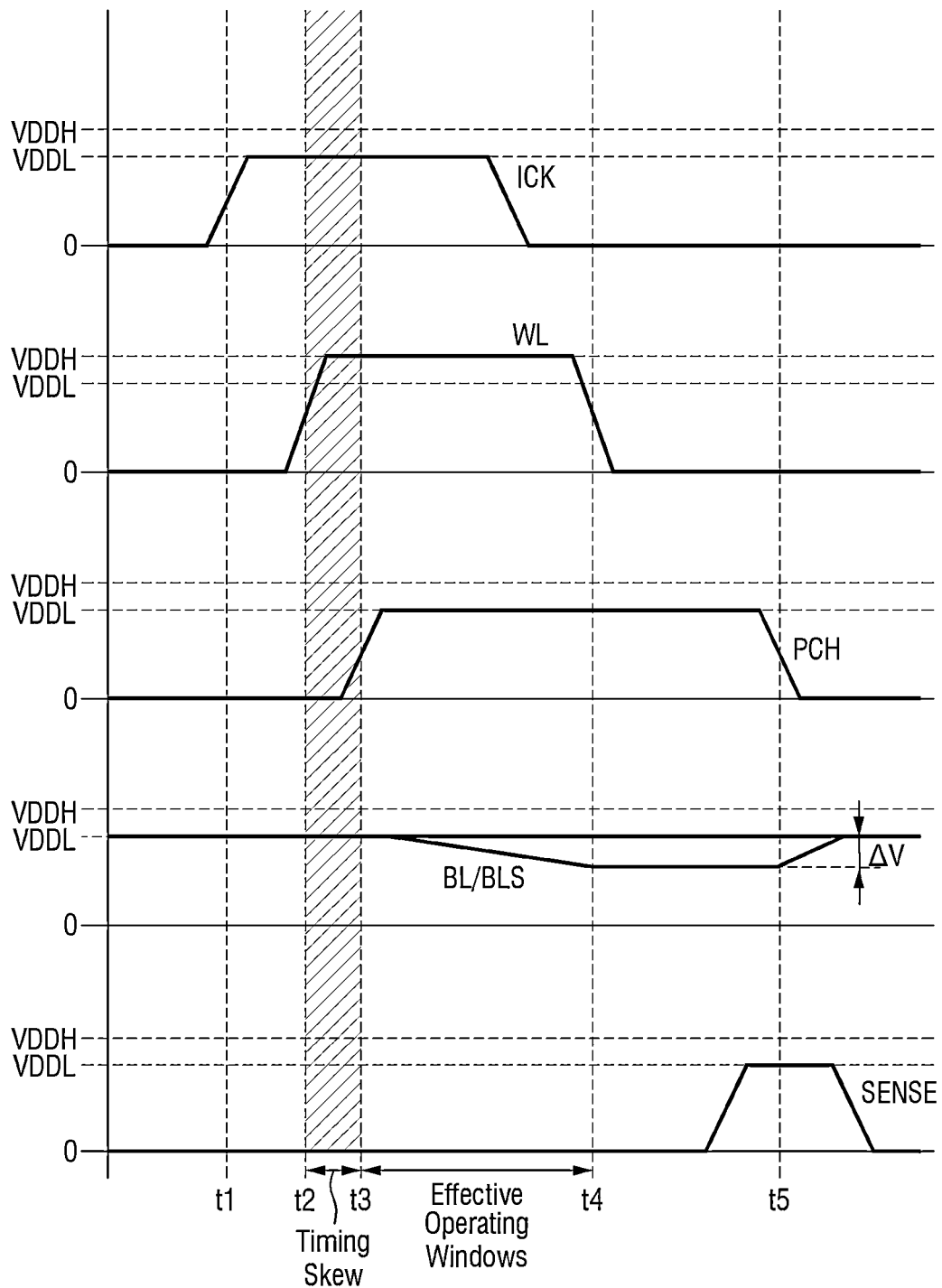
FIG. 15 is a timing diagram for explaining the operation of the memory device according to the embodiment of FIG. 14.

FIG. 15 is a timing diagram for explaining the operation of the memory device according to some example embodiments described with reference to FIG. 14.

Referring to FIG. 15, an internal clock signal ICK is output from an internal clock signal generator 220 at a time t1.

Thereafter, a row decoder 110 selects one of a plurality of wordlines of a memory cell array 130 in response to the internal clock signal ICK, and a wordline driver 120 applies a wordline voltage WL to the selected wordline so that the wordline voltage WL rises to as high as the first voltage VDDH at a time t2.

In response to the internal clock signal ICK being applied to a bitline precharge circuit 240, a bitline precharge voltage PCH rises to as high as the second voltage VDDL at a time t3.

For example, in the memory device 1 including the wordline predecoder 310 of FIG. 14, the row decoder 110 and the wordline driver 120, which operate at the first voltage VDDH, are faster than the bitline precharge circuit 240, the time t2 when the wordline voltage WL rises may be earlier than the time t3 when the bitline precharge voltage PCH rises. In this case, a period of time when the wordline voltage WL rises to the first voltage VDDH but the bitline precharge voltage PCH is yet to rise to the second voltage VDDL, i.e., a timing skew, occurs. However, the memory device 1 including the wordline predecoder 310 of FIG. 14 can reduce a timing skew, as compared the memory device according to some example embodiments described with reference to FIG. 13 that does not include the wordline predecoder 310.

Thereafter, the wordline voltage WL decreases back at a time t4, and the bitline precharge voltage PCH also decreases at a time t5. The pulse width of the wordline driving voltage WL may be (t4−t2), and the pulse width of the bitline precharge voltage PCH may be (t5−t3). As illustrated in FIG. 15, the pulse width of the wordline voltage WL may be smaller than the pulse width of the bitline precharge voltage PCH.

The memory device 1 according to some example embodiments described with reference to FIG. 14 can reduce a timing skew as compared to the memory device according to the embodiment of FIG. 13, and the effective operating window of the memory device 1 according to some example embodiments described with reference to FIG. 14 can be widened. Thus, a sufficient margin for a data read/write operation can be or more likely to be secured, and the operating reliability of the memory device 1 according to some example embodiments described with reference to FIG. 14 can be improved.

The operation of a wordline predecoder of a memory device according to some embodiments of inventive concepts will hereinafter be described.

Figure 16:
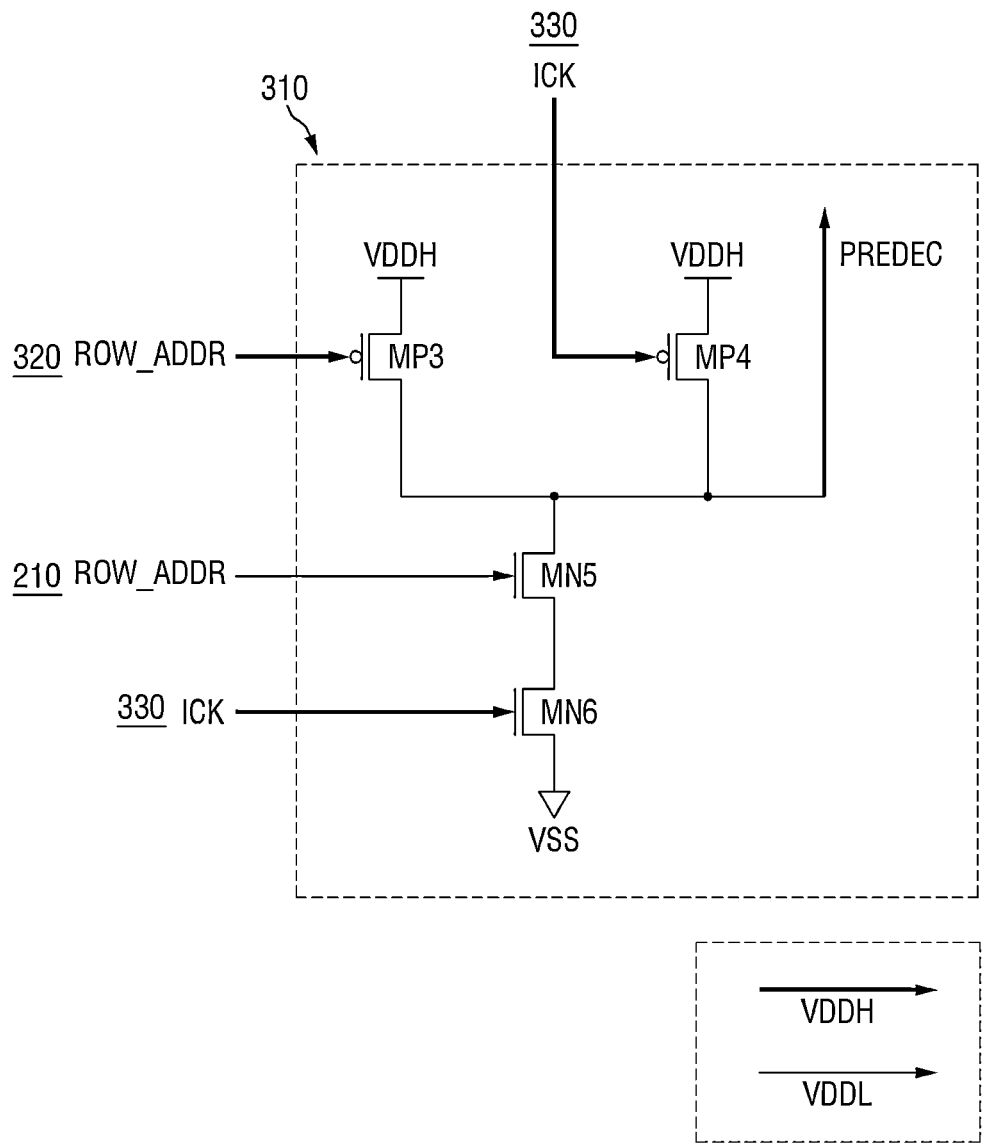
FIG. 16 is a circuit diagram for the operation of a wordline predecoder of a memory device in a case where the memory device is set to a low-power operation mode.

FIG. 16 is a circuit diagram for the operation of a wordline predecoder of a memory device according to some embodiments of inventive concepts in a case where the memory device is set to a low-power operation mode.

Referring to FIG. 16, a wordline predecoder 310 may include a third PMOS transistor MP3, a fourth PMOS transistor MP4, a fifth NMOS transistor MN5, and a sixth NMOS transistor MN6. A first voltage VDDH may be provided to the sources of the third and fourth PMOS transistors MP3 and MP4. The drains of the third and fourth PMOS transistors MP3 and MP4 may be electrically connected to each other. The third and fourth PMOS transistors MP3 and MP4 may receive a row address signal ROW_ADDR having the first voltage VDDH and an internal clock signal ICK having the first voltage VDDH as their gate voltages. For example, the third and fourth PMOS transistors MP3 and MP4 may form an OR logic circuit that performs an OR operation. The OR logic circuit may output a "predec" signal PREDEC as the first voltage VDDH based on the result of the OR operation.

However, the drain of the fifth NMOS transistor MN5 may be connected to the source of the sixth NMOS transistor MN6, and a third voltage VSS may be connected to the drain of the sixth NMOS transistor MN6. The fifth NMOS transistor MN5 may receive a row address signal ROW_ADDR having a second voltage VDDL as a gate voltage, and the sixth NMOS transistor MN6 may receive the internal clock signal ICK having the first voltage VDDH as a gate voltage. For example, the fifth and sixth NMOS transistors MN5 and MN6 may form an AND logic circuit that performs an AND operation. The AND logic circuit may ground the "predec" signal PREDEC to as low as the third voltage VSS based on the result of the AND operation.

Referring to FIG. 16, in a case where a memory device 1 is in the low-power operation mode, the row address signal ROW_ADDR having the first voltage VDDH and the internal clock signal ICK having the first voltage VDDH are provided to the gates of the third and fourth PMOS transistors MP3 and MP4 and the gate of the sixth NMOS transistor MN6. However, the internal clock signal ICK having the second voltage VDDL is provided to the gate of the fifth NMOS transistor MN5. In this case, as signals having a relatively high voltage (i.e., the first voltage VDDH) are provided to the gates of the third and fourth PMOS transistors MP3 and MP4 and the gate of the sixth NMOS transistor MN6, the amount of time that it takes to connect (or turn on) and disconnect (or turn off) the source and drain of each of the third and fourth PMOS transistors MP3 and MP4 and the sixth NMOS transistor MN6 can be reduced. On the contrary, as a signal having a relatively low voltage (i.e., the second voltage VDDL) is provided to the gate of the fifth NMOS transistor MN5, the amount of time that it takes to connect (or turn on) and disconnect (or turn off) the source and drain of the fifth NMOS transistor MN5 increases relatively. Thus, the operating speed of the memory device 1 may become slower in the low-speed operation mode than in the high-speed operation mode. However, as the second voltage VDDL, which is relatively low, is provided to a peripheral circuit 200, the power consumption of the memory device 1 can be reduced.

For example, the internal clock signal ICK provided to the gate of the fourth PMOS transistor MP4 may be generated from second level shifter 330, while the row address ROW_ADDR provided to the gate of the third PMOS transistor MP3 may be generated from the first level shifter 320. Furthermore, the row address signal ROW_ADDR provided to the gate of the fifth NMOS transistor MN5 may be generated from the address latch 210, while the internal clock signal ICK provided to the gate of the sixth NMOS transistor MN6 may be generated from the second level shifter 330.

The operation of the memory device according to some example embodiments described with reference to FIG. 16 may be similar to the operation of the memory device according to some example embodiments described with reference to FIG. 15. For example, as a signal having the second voltage VDDL is applied to only one of the fifth and sixth NMOS transistors MN5 and MN6, the effect of delaying the rise of the wordline voltage VDDH can be slightly reduced, but due to the presence of only one level shifter, some example embodiments described with reference to FIG. 16 may be beneficial in terms of integration density.

A memory device according to some example embodiments of inventive concepts will hereinafter be described.

Figure 17:
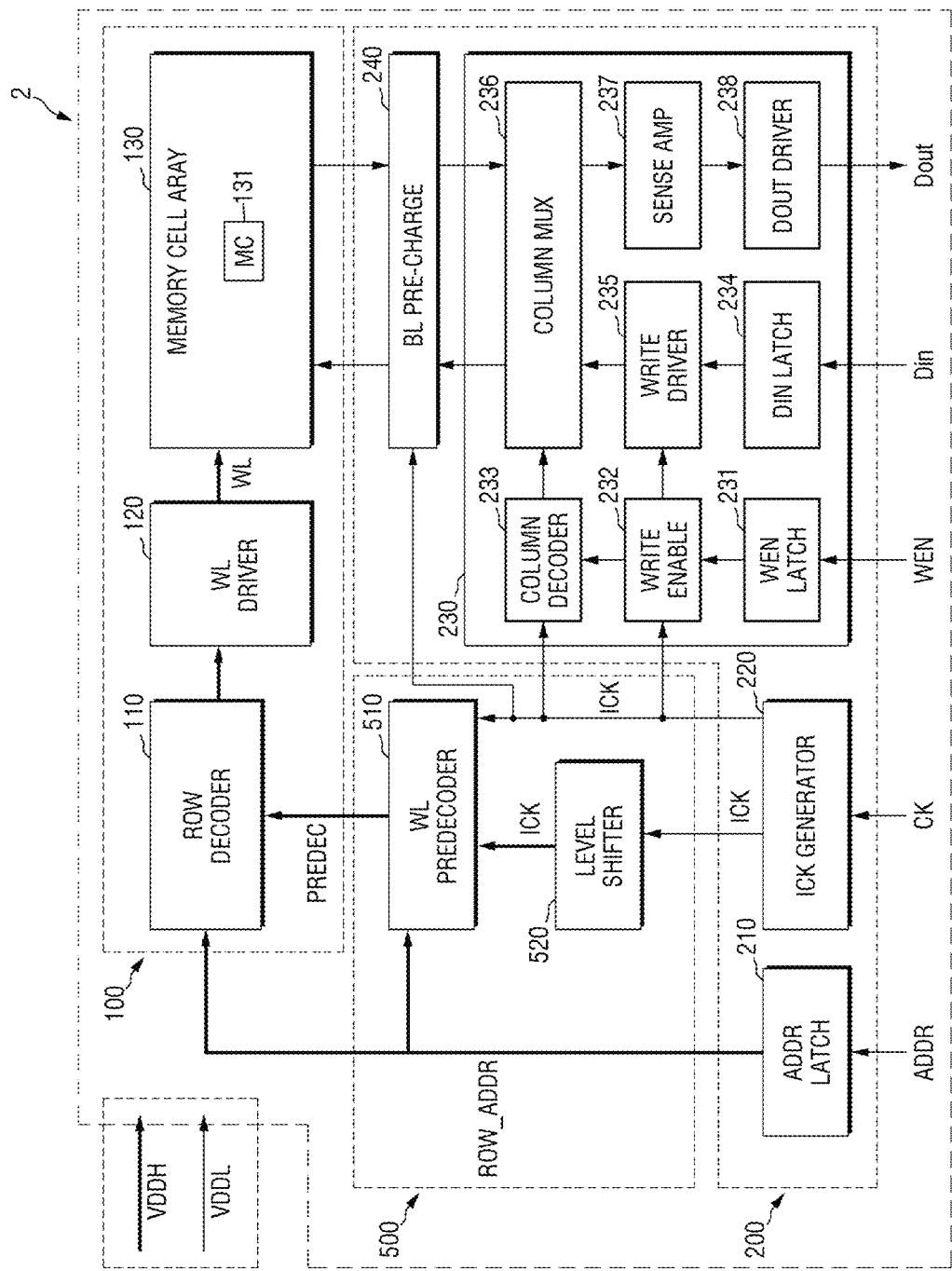
FIG. 17 is a block diagram of a memory device according to some embodiments of inventive concepts.
Figure 18:
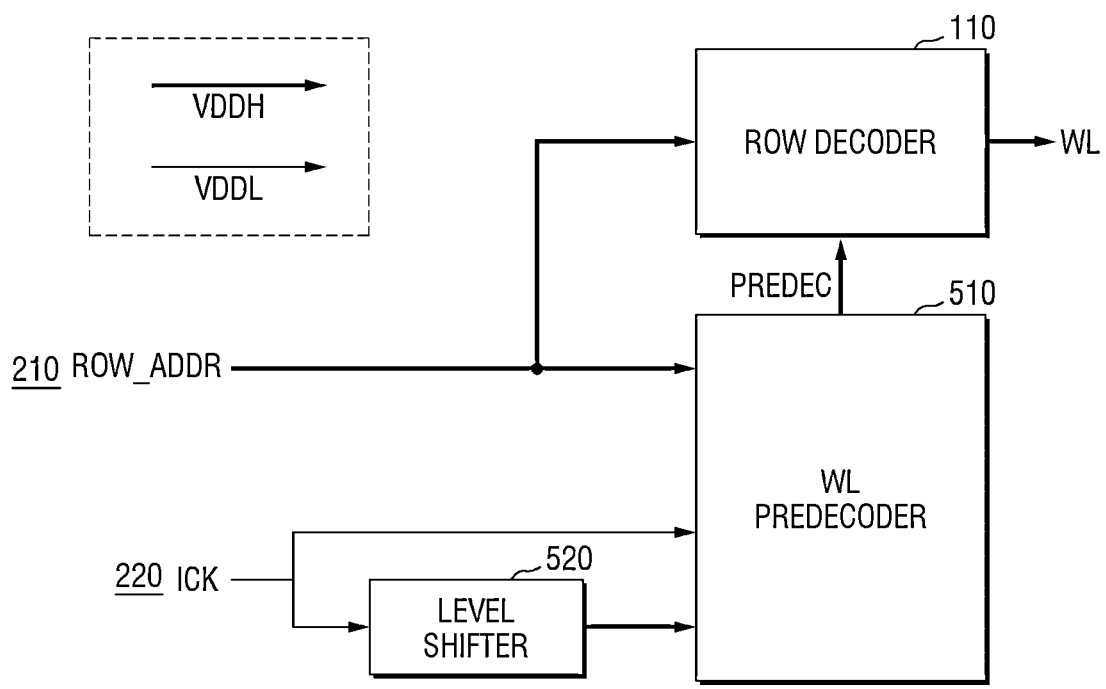
FIG. 18 is a block diagram for explaining a wordline predecoder of FIG. 17.
Figure 19:
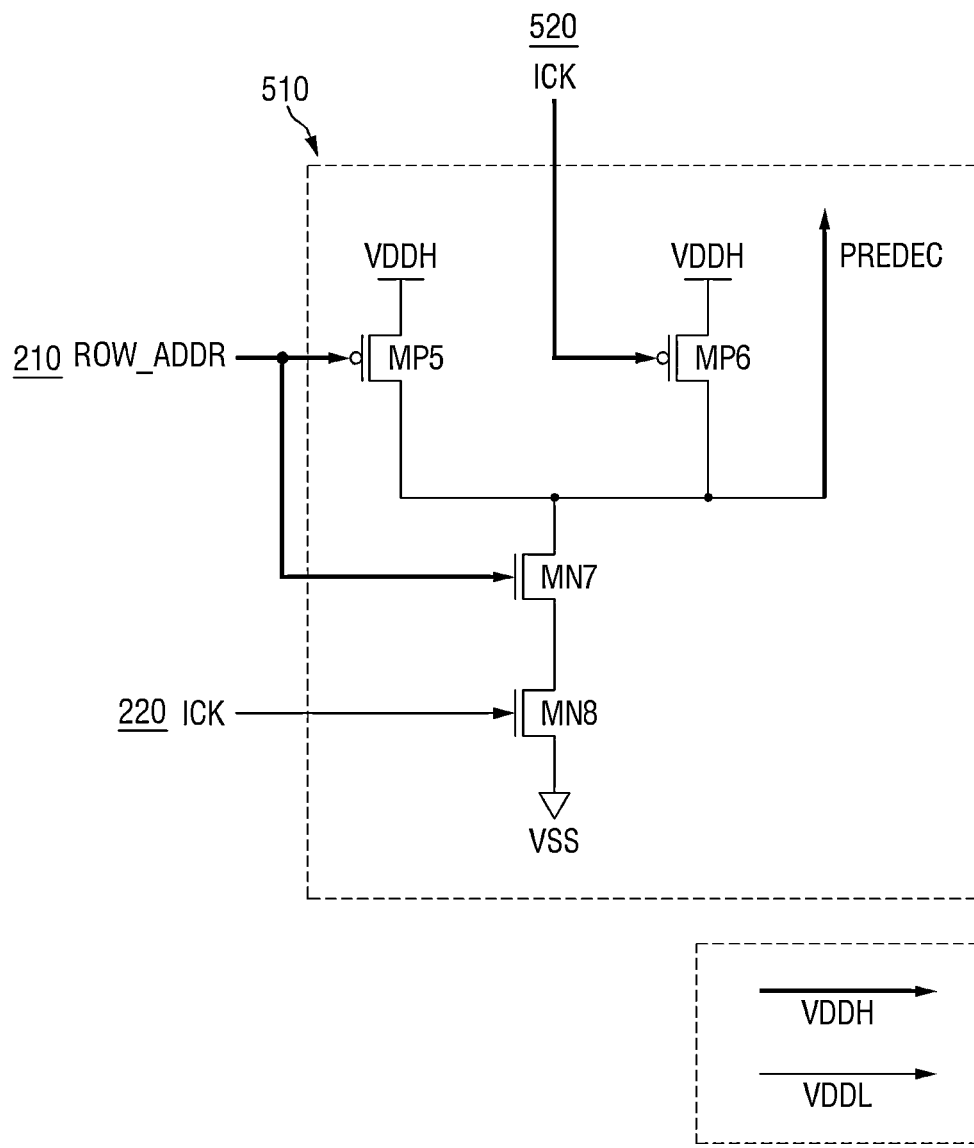
FIG. 19 is a circuit diagram for explaining the wordline predecoder of FIG. 17 in a case where the memory device of FIG. 17 is set to a low-power operation mode.

FIG. 17 is a block diagram of a memory device according to some embodiments of inventive concepts. FIG. 18 is a block diagram for explaining a wordline predecoder of FIG. 17. FIG. 19 is a circuit diagram for explaining the wordline predecoder of FIG. 17 in a case where the memory device of FIG. 17 is set to a low-power operation mode.

Referring to FIG. 17, a memory device 2 may include a memory circuit 100, a peripheral circuit 200, and a predecoder circuit 500. The predecoder circuit 500 may include a wordline predecoder ("WL PREDECODER") 510 and a level shifter 520. The wordline predecoder 510 may receive a row address signal ROW_ADDR from an address latch 210, may receive an internal clock signal ICK from an internal clock signal generator 220, and may generate a "predec" signal PREDEC based on the row address signal ROW_ADDR and the internal clock signal ICK. The level shifter 520 may receive the internal clock signal ICK from the internal clock signal generator 220, may level-shift the internal clock signal ICK, and may provide the level-shifted internal clock signal ICK to the wordline predecoder 510. The wordline predecoder 510 may be directly connected to the internal clock signal generator 220 to receive the internal clock signal ICK, or may receive the level-shifted internal clock signal ICK from the level shifter 520. The wordline predecoder 510 may be directly connected to the address latch 210 to receive the row address signal ROW_ADDR. For example, the wordline predecoder 510 may receive an internal clock signal ICK having a first voltage VDDH or an internal clock signal ICK having a second voltage VDDL and may also receive a row address signal ROW_ADDR having the first voltage VDDH.

Referring to FIG. 18, the row address signal ROW_ADDR may be provided to the wordline predecoder 510 as the first voltage VDDH, and the internal clock signal ICK may be provided to the wordline predecoder 510 as a dual voltage consisting of or including the first and second voltages VDDH and VDDL. The row address signal ROW_ADDR having the first voltage VDDH may be provided from the address latch 210 to the wordline predecoder 510. On the contrary, the internal clock signal ICK having the second voltage VDDL may be provided from the internal clock signal generator 220 to the wordline predecoder 510, and an internal clock signal ICK level-shifted from the second voltage VDDL to the first voltage VDDH by the level shifter 520 may be provided to the wordline predecoder 510.

Referring to FIG. 19, the wordline predecoder 510 may include a fifth PMOS transistor MP5, a sixth PMOS transistor MP6, a seventh NMOS transistor MN7, and an eighth NMOS transistor MN8. The first voltage VDDH may be provided to the sources of the fifth and sixth PMOS transistors MP5 and MP6. The drains of the fifth and sixth PMOS transistors MP5 and MP6 may be electrically connected to each other. The fifth and sixth PMOS transistors MP5 and MP6 may receive the row address signal ROW_ADDR having the first voltage VDDH and the internal clock signal ICK having the first voltage VDDH as their gate voltages. For example, the fifth and sixth PMOS transistors MP5 and MP6 may form an OR logic circuit that performs an OR operation. The OR logic circuit may output a "predec" signal PREDEC as the first voltage VDDH based on the result of the OR operation.

On the contrary, the drain of the seventh NMOS transistor MN7 may be connected to the source of the eighth NMOS transistor MN8, and a third voltage VSS may be connected to the drain of the eighth NMOS transistor MN8. The seventh NMOS transistor MN7 may receive the row address signal ROW_ADDR having the second voltage VDDL as a gate voltage, and the eighth NMOS transistor MN8 may receive the internal clock signal ICK having the second voltage VDDL as a gate voltage. That is, the seventh and eighth NMOS transistors MN7 and MN8 may form an AND logic circuit that performs an AND operation. The AND logic circuit may ground the "predec" signal PREDEC to as low as the third voltage VSS based on the result of the AND operation.

Referring to FIG. 19, in a case where the memory device 2 is in the low-power operation mode, the row address signal ROW_ADDR having the first voltage VDDH and the internal clock signal ICK having the first voltage VDDH are provided to the gates of the fifth and sixth PMOS transistor MP5 and MP6 and the gate of the seventh NMOS transistor MN7. On the contrary, the internal clock signal ICK having the second voltage VDDL is provided to the gate of the eighth NMOS transistor MN8. In this case, as signals having a relatively high voltage (i.e., the first voltage VDDH) are provided to the gates of the fifth and sixth PMOS transistors MP5 and MP6 and the gate of the seventh NMOS transistor MN7, the amount of time that it takes to connect (or turn on) and disconnect (or turn off) the source and drain of each of the fifth and sixth PMOS transistors MP5 and MP6 and the seventh NMOS transistor MN7 can be reduced. On the contrary, as a signal having a relatively low voltage (i.e., the second voltage VDDL) is provided to the gate of the eighth NMOS transistor MN8, the amount of time that it takes to connect (or turn on) and disconnect (or turn off) the source and drain of the eighth NMOS transistor MN8 increases relatively. Thus, the operating speed of the memory device 2 may become slower in the low-speed operation mode than in a high-speed operation mode. However, as the second voltage VDDL, which is relatively low, is provided to a peripheral circuit 200, the power consumption of the memory device 2 can be reduced.

The operation of the memory device 2 may be similar to the operation of the memory device according to some example embodiments described with reference to FIG. 15. That is, as a signal having the second voltage VDDL is applied to only one of the seventh and eighth NMOS transistors MN7 and MN8, the effect of delaying the rise of the wordline voltage VDDH can be slightly reduced, but due to the presence of only one level shifter, some example embodiments described with reference to FIG. 17 may be beneficial in terms of integration density.

A memory device according to some embodiments of inventive concepts will hereinafter be described.

Figure 20:
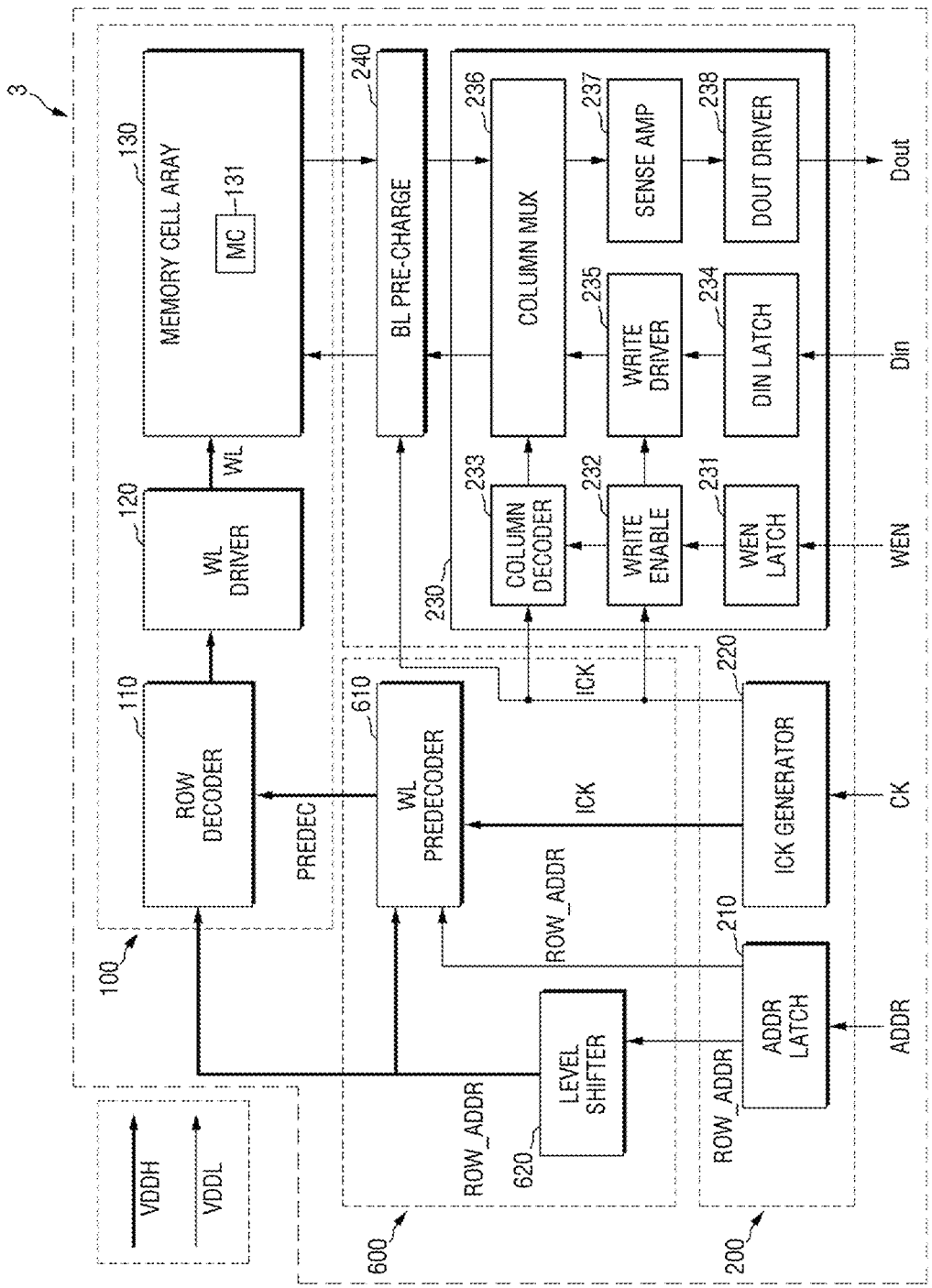
FIG. 20 is a block diagram of a memory device according to some embodiments of inventive concepts.
Figure 21:
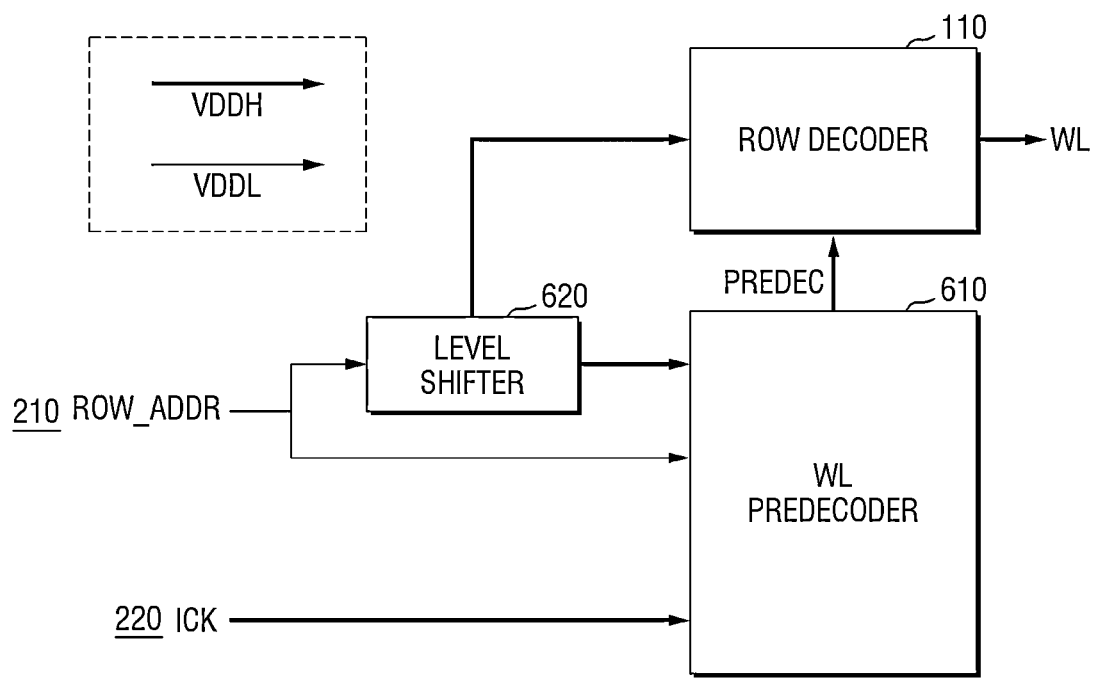
FIG. 21 is a block diagram for explaining a wordline predecoder of FIG. 20.
Figure 22:
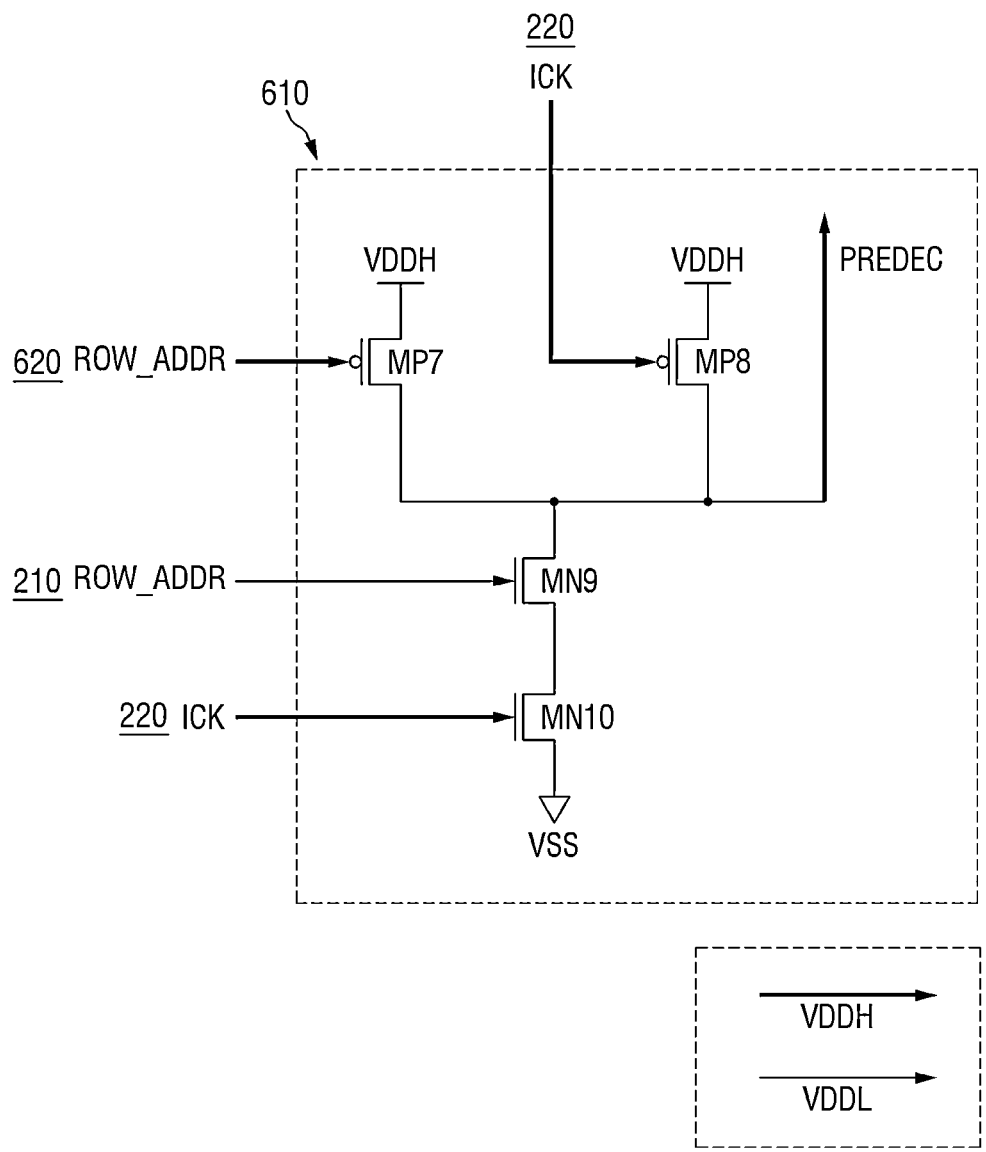
FIG. 22 is a circuit diagram for explaining the wordline predecoder of FIG. 20 in a case where the memory device of FIG. 20 is set to a low-power operation mode.

FIG. 20 is a block diagram of a memory device according to some embodiments of inventive concepts. FIG. 21 is a block diagram for explaining a wordline predecoder of FIG. 20. FIG. 22 is a circuit diagram for explaining the wordline predecoder of FIG. 20 in a case where the memory device of FIG. 20 is set to a low-power operation mode.

Referring to FIG. 20, a memory device 3 may include a memory circuit 100, a peripheral circuit 200, and a predecoder circuit 600. The predecoder circuit 600 may include a wordline predecoder ("WL PREDECODER") 610 and a level shifter 620. The wordline predecoder 610 may receive a row address signal ROW_ADDR from an address latch 210, may receive an internal clock signal ICK from an internal clock signal generator 220, and may generate a "predec" signal PREDEC based on the row address signal ROW_ADDR and the internal clock signal ICK. The level shifter 620 may receive the row address signal ROW_ADDR from the address latch 210, may level-shift the row address signal ROW_ADDR, and may provide the level-shifted row address signal ROW_ADDR to the wordline predecoder 610. The wordline predecoder 610 may be directly connected to the address latch 210 to receive the row address signal ROW_ADDR or may receive the level-shifted row address signal ROW_ADDR. The wordline predecoder 610 may be directly connected to the internal clock signal generator 220 to receive the internal clock signal ICK. That is, the wordline predecoder 610 may receive a row address signal ROW_ADDR having a first voltage VDDH or a row address signal ROW_ADDR having a second voltage VDDL and may also receive an internal clock signal ICK having the first voltage VDDH.

Referring to FIG. 21, the row address signal ROW_ADDR may be provided to the wordline predecoder 610 as a dual voltage consisting of or including the first and second voltages VDDH and VDDL, and the internal clock signal ICK may be provided to the wordline predecoder 610 as the first voltage VDDH. The row address signal ROW_ADDR having the first voltage VDDH may be provided from the address latch 210 to the wordline predecoder 610, and a row address signal ROW_ADDR level-shifted from the second voltage VDDL to the first voltage VDDH by the level shifter 620 may be provided to the wordline decoder 610. On the contrary, the internal clock signal ICK having the first voltage VDDH may be provided from the internal clock signal generator 220 to the wordline predecoder 610.

Referring to FIG. 22, the wordline predecoder 610 may include a seventh PMOS transistor MP7, an eighth PMOS transistor MP8, a ninth NMOS transistor MN9, and a tenth NMOS transistor MN10. The first voltage VDDH may be provided to the sources of the seventh and eighth PMOS transistors MP7 and MP8. The drains of the seventh and eighth PMOS transistors MP7 and MP8 may be electrically connected to each other. The seventh and eighth PMOS transistors MP7 and MP8 may receive the row address signal ROW_ADDR having the first voltage VDDH and the internal clock signal ICK having the first voltage VDDH as their gate voltages. That is, the seventh and eighth PMOS transistors MP7 and MP8 may form an OR logic circuit that performs an OR operation. The OR logic circuit may output a "predec" signal PREDEC as the first voltage VDDH based on the result of the OR operation.

On the contrary, the drain of the ninth NMOS transistor MN9 may be connected to the source of the tenth NMOS transistor MN10, and a third voltage VSS may be connected to the drain of the tenth NMOS transistor MN10. The ninth NMOS transistor MN9 may receive the row address signal ROW_ADDR having the second voltage VDDL as a gate voltage, and the tenth NMOS transistor MN10 may receive the internal clock signal ICK having the second voltage VDDL as a gate voltage. That is, the ninth and tenth NMOS transistors MN9 and MN10 may form an AND logic circuit that performs an AND operation. The AND logic circuit may ground the "predec" signal PREDEC to as low as the third voltage VSS based on the result of the AND operation.

Referring to FIG. 22, in a case where the memory device 3 is in the low-power operation mode, the row address signal ROW_ADDR having the first voltage VDDH and the internal clock signal ICK having the first voltage VDDH are provided to the gates of the seventh and eighth PMOS transistor MP7 and MP8 and the gate of the tenth NMOS transistor MN10. On the contrary, the internal clock signal ICK having the second voltage VDDL is provided to the gate of the ninth NMOS transistor MN9. In this case, as signals having a relatively high voltage (i.e., the first voltage VDDH) are provided to the gates of the seventh and eighth PMOS transistors MP7 and MP8 and the gate of the tenth NMOS transistor MN10, the amount of time that it takes to connect (or turn on) and disconnect (or turn off) the source and drain of each of the seventh and eighth PMOS transistors MP7 and MP8 and the tenth NMOS transistor MN10 can be reduced. On the contrary, as a signal having a relatively low voltage (i.e., the second voltage VDDL) is provided to the gate of the ninth NMOS transistor MN9, the amount of time that it takes to connect (or turn on) and disconnect (or turn off) the source and drain of the ninth NMOS transistor MN9 increases relatively. Thus, the operating speed of the memory device 3 may become slower in the low-speed operation mode than in a high-speed operation mode. However, as the second voltage VDDL, which is relatively low, is provided to a peripheral circuit 200, the power consumption of the memory device 3 can be reduced.

The operation of the memory device 3 may be similar to the operation of the memory device according to example embodiments described with reference to FIG. 15. For example as a signal having the second voltage VDDL is applied to only one of the ninth and tenth NMOS transistors MN9 and MN10, the effect of delaying the rise of the wordline voltage VDDH can be slightly reduced, but due to the presence of only one level shifter, example embodiments described with reference to FIG. 20 may be beneficial in terms of integration density.

Figure 23:
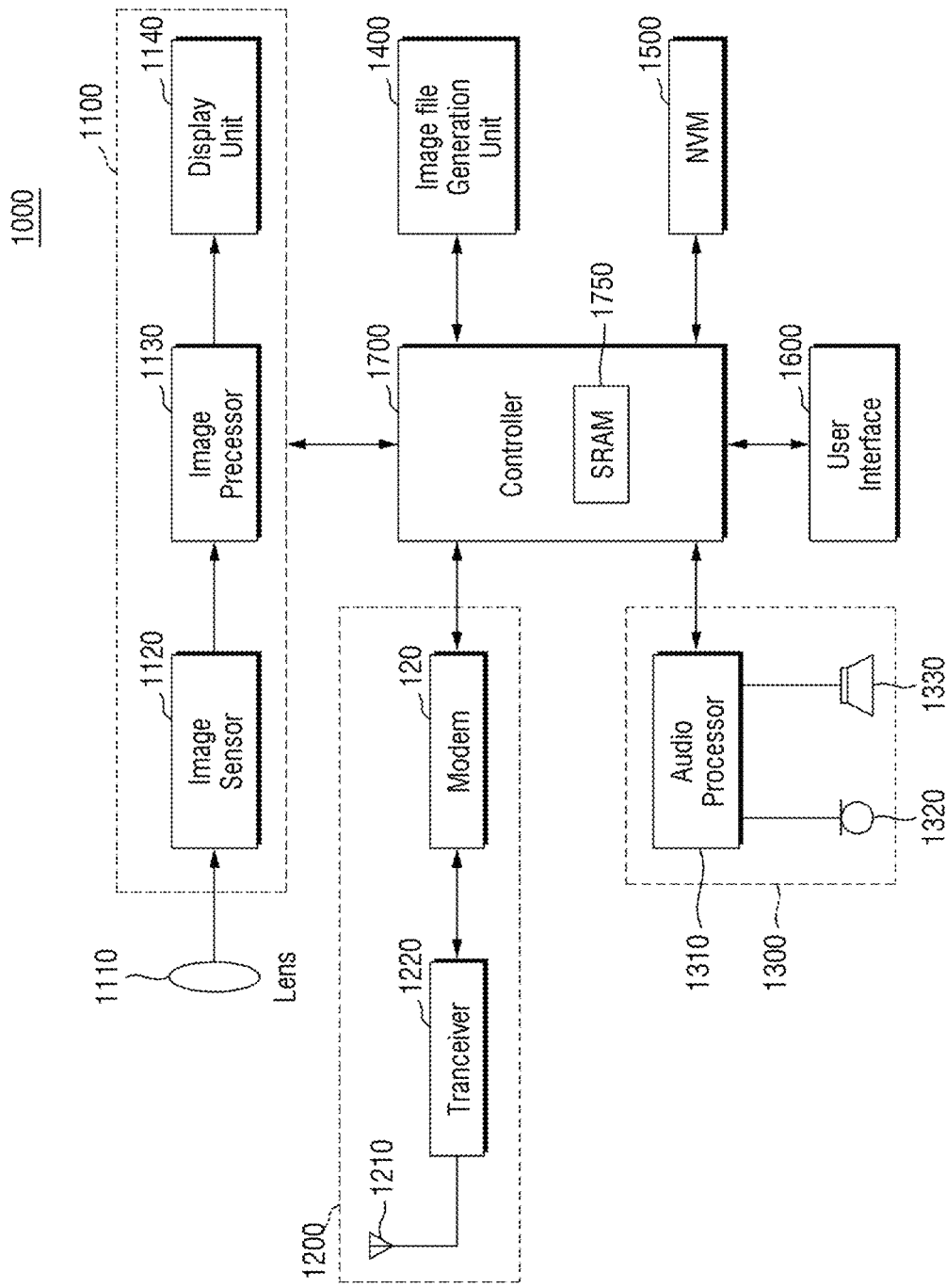
FIG. 23 is a block diagram of a mobile terminal, to which embodiments of inventive concepts are applicable.

FIG. 23 is a block diagram of a mobile terminal, to which embodiments of inventive concepts are applicable.

Referring to FIG. 23, a mobile terminal 1000 includes an image processing unit 1100, a radio transmission/reception unit 1200, an audio processing unit 1300, an image file generation unit 1400, a nonvolatile memory device ("NVM") 1500, a user interface 1600, and a controller 1700.

The image processing unit 1100 includes a lens 1110, an image sensor 1120, an image processor 1130, and a display unit 1140. The radio transmission/reception unit 1200 includes an antenna 1210, a transceiver 1220, and a modem 1230. The audio processing unit 1300 includes an audio processor 1310, a microphone 1320, and a speaker 1330.

The mobile terminal 1000 may include various semiconductor devices. An application processor that performs the functions of the controller 1700 is required to exhibit high performance while consuming less power. Accordingly, the controller 1700 may be provided as a multicore through a miniaturization process. The controller 1700 may include an SRAM 1750, which is equipped with a wordline predecoder according to some example embodiments of inventive concepts. Even though the SRAM 1750 is driven in a dual-voltage manner, a timing skew can be reduced, and/or a sufficient operating margin may be or be made more likely to be secured in connection with the input/output of data to/from memory cells.

A system-on-chip (SoC) according to some embodiments of inventive concepts may be formed using various types of packages. For example, the SoC may be include and/or be formed using at least one of package-on-package (PoP), a ball grid array (BGA), a chip scale package (CSP), a plastic leaded chip carrier (PLCC), a plastic dual in-line package (PDIP), a die-in waffle pack, a die-in wafer form, a chip-on-board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a thin quad flat pack (TQFP), a system-in-package (SIP), a multi-chip package (MCP), a wafer-level fabricated package (WFP), or a wafer-level processed stack package (WSP).

Any of the elements disclosed above may include and/or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Some example embodiments of inventive concepts have been described above with reference to the accompanying drawings, but inventive concepts are not limited thereto and may be implemented in various different forms. It will be understood that Invent inventive concepts can be implemented in other specific forms without changing the technical spirit or gist of inventive concepts. Furthermore example embodiments are not necessarily mutually exclusive. For example, some example embodiments may include features described with reference to one or more figures, and may also include features described with reference to one or more other figures. Therefore, it should be understood that example embodiments set forth herein are illustrative in all respects and not limiting.

What is claimed is:

1. A memory device comprising:
   a memory cell configured to store data based on a first voltage;
   a row decoder configured to select a wordline of the memory cell based on the first voltage; and
   a wordline predecoder configured to generate a "predec" signal associated with generating a wordline voltage to be provided to the row decoder,
   wherein the wordline predecoder is
   configured to be driven by the first voltage and by a second voltage which is different from the first voltage,
   configured to receive a row address signal associated with selecting the wordline, and to receive an internal clock signal associated with adjusting operating timings of elements included in the memory device,
   configured to perform a NAND operation on the row address signal and the internal clock signal, and configured to provide the "predec" signal generated based on a result of the NAND operation to the row decoder, wherein
   the performing the NAND operation includes concurrently providing the first voltage to a gate of a first pull-up transistor of a NAND gate, a gate of a second pull-up transistor of the NAND gate, and a gate of a first pull-down transistor of the NAND gate, concurrently with providing the second voltage to a gate of a second pull-down transistor of the NAND gate.

2. The memory device of claim 1, wherein the wordline predecoder includes first and second P-type metal-oxide-semiconductor (PMOS) transistors and first and second N-type metal-oxide-semiconductor (NMOS) transistors, the first and second PMOS transistors and the first and second NMOS transistors configured to be gated by the row address signal or the internal clock signal.

3. The memory device of claim 2, wherein gates of the first and second PMOS transistors are configured to be at the first voltage.

4. The memory device of claim 2, wherein a gate of the first NMOS transistor is configured to be at the second voltage.

5. The memory device of claim 2, wherein a gate of the second NMOS transistor is configured to be at the second voltage.

6. The memory device of claim 2, further comprising:
   a first level shifter,
   wherein the first level shifter is configured to level-shift the row address signal from the second voltage to the first voltage and to provide the level-shifted row address signal to the first and second PMOS transistors.

7. The memory device of claim 6, wherein the first NMOS transistors is configured to be gated by the level-shifted row address signal having the first voltage.

8. The memory device of claim 6, further comprising:
   a second level shifter,
   wherein the second level shifter is configured to level-shift the internal clock signal from the second voltage to the first voltage and to provide the level-shifted internal clock signal to the first and second PMOS transistors.

9. The memory device of claim 8, wherein the second NMOS transistors are configured to be gated by the level-shifted internal clock signal having the first voltage.

10. The memory device of claim 1, wherein
    the row decoder includes a transmission gate and an inverter,
    the inverter is connected to an output terminal of the row decoder, and
    the memory device is configured to provide the "predec" signal to the transmission gate as an input signal.

11. The memory device of claim 1, further comprising:
    a first level shifter configured to level-shift the row address signal from the second voltage to the first voltage and to provide the level-shifted row address signal to the wordline predecoder; and
    a second level shifter configured to level-shift the internal clock signal from the second voltage to the first voltage and to provide the level-shifted internal clock signal to the wordline predecoder.

12. The memory device of claim 11, wherein
    a gate of a first PMOS transistor of the wordline predecoder is configured to be connected to the level-shifted row address signal having the first voltage, and a gate of a second PMOS transistor of the wordline predecoder is configured to be connected to the level-shifted internal clock signal having the first voltage.

13. The memory device of claim 12, wherein a gate of an NMOS transistor of the wordline predecoder is configured to be connected to at least one of the row address signal having the second voltage and the internal clock signal having the second voltage.

14. A memory device comprising:
a static random-access memory (SRAM) cell connected to a wordline and a bitline;
a wordline driver configured to provide a wordline voltage having a first voltage to the wordline;
a bitline precharge circuit configured to provide a bitline voltage having a second voltage, which is lower than the first voltage, to the bitline; and
a wordline predecoder configured to generate a "predec" signal, which is associated with enabling the wordline voltage,
wherein the wordline predecoder includes
a first pull-up transistor which is configured to pull up the "predec" signal based on a first control signal having the first voltage,
a second pull-up transistor, which is configured to pull up the "predec" signal based on a second control signal having the first voltage,
a first pull-down transistor, which is configured to pull down the "predec" signal based on the second control signal having the second voltage, and
a second pull-down transistor, which is configured to pull down the "predec" signal based on the first control signal having the first voltage, the pulling up based on the first control signal being concurrent with the pulling down based on the second control signal.

15. The memory device of claim 14, wherein
the first control signal includes an internal clock signal associated with adjusting operating timings of elements included in the memory device, and
the second control signal includes a row address signal associated with selecting the wordline.

16. The memory device of claim 14, further comprising:
a level shifter,
wherein the level shifter is configured to level-shift the second control signal from the second voltage to the first voltage and to provide the level-shifted second control signal to the wordline predecoder.

17. The memory device of claim 14, further comprising:
first and second level shifters,
wherein the first and second level shifters are configured to level-shift the second control signal from the second voltage to the first voltage and to provide the level-shifted second control signal to the wordline predecoder.

18. An operating method of a memory device, comprising:
allowing an internal clock signal to transition from a first level to a second level;
in response to the internal clock signal transitioning to the second level, allowing a bitline precharge voltage to rise from the first level to the second level at a first time; and
in response to the internal clock signal transitioning to the second level, allowing a wordline voltage to rise from the first level to a third level, which is greater than the second level, at a second time, which is later than the first time.

19. The operating method of claim 18, further comprising:
allowing the wordline voltage to fall from the third level to the first level at a third time, which is later than the second time; and
allowing the bitline precharge voltage to fall from the second level to the first level at a fourth time, which is later than the third time.

\* \* \* \* \*